(12) United States Patent
Girdhar et al.

(10) Patent No.: US 8,492,225 B2
(45) Date of Patent: Jul. 23, 2013

(54) INTEGRATED TRENCH GUARDED SCHOTTKY DIODE COMPATIBLE WITH POWERDIE, STRUCTURE AND METHOD

(75) Inventors: Dev Alok Girdhar, Indialantic, FL (US); Francois Hebert, San Mateo, CA (US)

(73) Assignee: Intersil Americas Inc., Milpitas, CA (US)

( * ) Notice: Subject to any disclaimer, the term of this patent is extended or adjusted under 35 U.S.C. 154(b) by 330 days.

(21) Appl. No.: 12/938,589

(22) Filed: Nov. 3, 2010

(65) Prior Publication Data

US 2011/0156679 A1 Jun. 30, 2011

Related U.S. Application Data

(60) Provisional application No. 61/291,145, filed on Dec. 30, 2009.

(51) Int. Cl.
H01L 21/336 (2006.01)

(52) U.S. Cl.
USPC ............ 438/270; 257/334; 257/E27.016; 438/237

(58) Field of Classification Search
USPC ............ 257/334, E27.016; 438/237, 259, 438/269, 271, 276, 270
See application file for complete search history.

(56) References Cited

U.S. PATENT DOCUMENTS

| | | | |
|---|---|---|---|
| 5,365,102 A | 11/1994 | Mehrotra et al. | |
| 5,973,367 A | 10/1999 | Williams | |
| 6,621,107 B2 * | 9/2003 | Blanchard et al. | 257/155 |
| 6,998,678 B2 | 2/2006 | Werner et al. | |
| 7,285,822 B2 * | 10/2007 | Bhalla et al. | 257/330 |
| 7,700,977 B2 | 4/2010 | Church et al. | |
| 7,750,426 B2 | 7/2010 | Girdhar et al. | |
| 7,791,136 B1 * | 9/2010 | Hsieh | 257/330 |
| 8,022,474 B2 | 9/2011 | Haeberlen et al. | |
| 8,168,496 B2 | 5/2012 | Hebert | |
| 8,368,140 B2 * | 2/2013 | Chuang | 257/334 |
| 2003/0020134 A1 | 1/2003 | Werner et al. | |
| 2006/0180855 A1 | 8/2006 | Bhalla et al. | |
| 2006/0231904 A1 | 10/2006 | Kocon | |
| 2008/0023785 A1 | 1/2008 | Hebert | |
| 2008/0246082 A1 | 10/2008 | Hshieh | |
| 2009/0065861 A1 | 3/2009 | Bhalla et al. | |
| 2009/0159928 A1 | 6/2009 | Madathil et al. | |
| 2010/0155836 A1 | 6/2010 | Hebert | |
| 2010/0155837 A1 | 6/2010 | Hebert | |
| 2010/0155915 A1 | 6/2010 | Bell et al. | |

(Continued)

OTHER PUBLICATIONS

U.S. Patent and Trademark Office, "Final Office Action", "U.S. Appl. No. 12/898,664", Oct. 24, 2012, pp. 1-13.

(Continued)

*Primary Examiner* — John C Ingham
(74) *Attorney, Agent, or Firm* — Fogg & Powers LLC

(57) ABSTRACT

A method and structure for a voltage converter including a trench field effect transistor (FET) and a trench guarded Schottky diode which is integrated with the trench FET. In an embodiment, a voltage converter can include a lateral FET, a trench FET, and a trench guarded Schottky diode integrated with the trench FET. A method to form a voltage converter can include the formation of a trench FET gate, a trench guarded Schottky diode gate, and a lateral FET gate using a single conductive layer such as a polysilicon layer.

8 Claims, 20 Drawing Sheets

U.S. PATENT DOCUMENTS

| | | |
|---|---|---|
| 2010/0276752 A1 | 11/2010 | Hebert |
| 2010/0328512 A1 | 12/2010 | Davidovici |
| 2011/0042727 A1 | 2/2011 | Pan et al. |
| 2011/0121387 A1 | 5/2011 | Hebert et al. |
| 2011/0121808 A1 | 5/2011 | Girdhar et al. |
| 2011/0156682 A1 | 6/2011 | Girdhar et al. |
| 2011/0156810 A1 | 6/2011 | Girdhar et al. |
| 2011/0163434 A1 | 7/2011 | Bell et al. |

OTHER PUBLICATIONS

U.S. Patent and Trademark Office, "Office Action", "U.S. Appl. No. 12/898,664", Jun. 11, 2012.

U.S. Patent and Trademark Office, "Final Office Action", "U.S. Appl. No. 12/770,074", Aug. 14, 2012, pp. 1-15.

U.S. Patent and Trademark Office, "Office Action", "U.S. Appl. No. 12/770,074", Apr. 10, 2012, pp. 1-27.

Calafut, "Trench Power MOSFET Lowside Switch with Optimized Integrated Schottky Diode", ISPSD 2004.

Mehrotra et al., "The Trench MOS Barrier Schottky (TMBS) Rectifier", in IEDM 93.

Hebert et al., "Integrated Guarded Schottky Diode Compatible with Trench-Gate DMOS, Structure and Method", U.S. Appl. No. 12/770,074, filed Apr. 28, 2010.

Hebert, "Co-Packaging Approach for Power Converters Based on Planar Devices, Structure and Method", U.S. Appl. No. 12/470,229, filed May 21, 2009.

Girdhar et al., "Voltage Converter and Systems Including Same", U.S. Appl. No. 12/796,178, filed Jun. 8, 2010.

Girdhar et al., "Voltage Converter With Integrated Schottky Device and Systems Including Same", U.S. Appl. No. 12/898,664, filed Oct. 5, 2010.

Girdhar et al., "Integrated DMOS and Schottky ", U.S. Appl. No. 12/944,836, filed Nov. 12, 2010.

\* cited by examiner

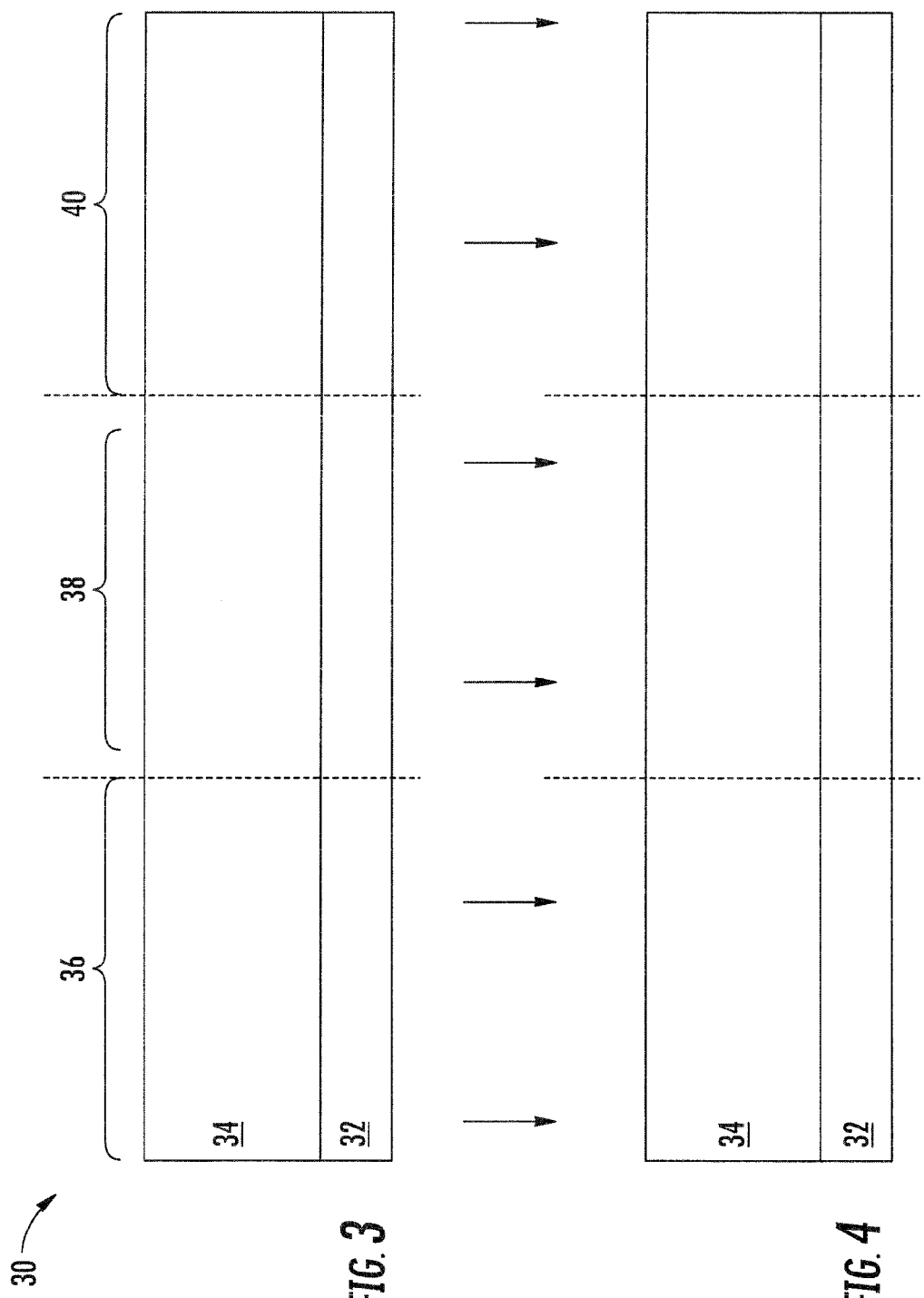

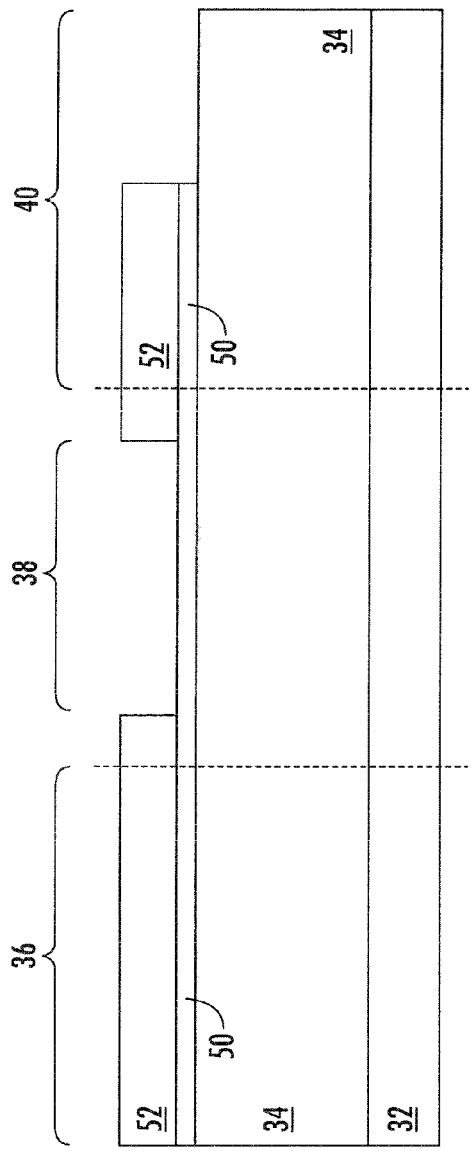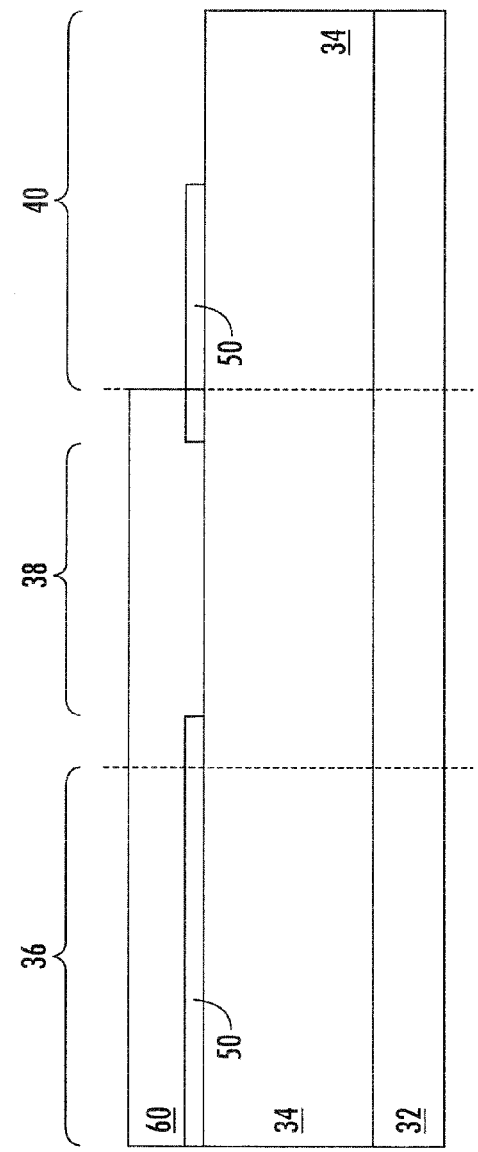

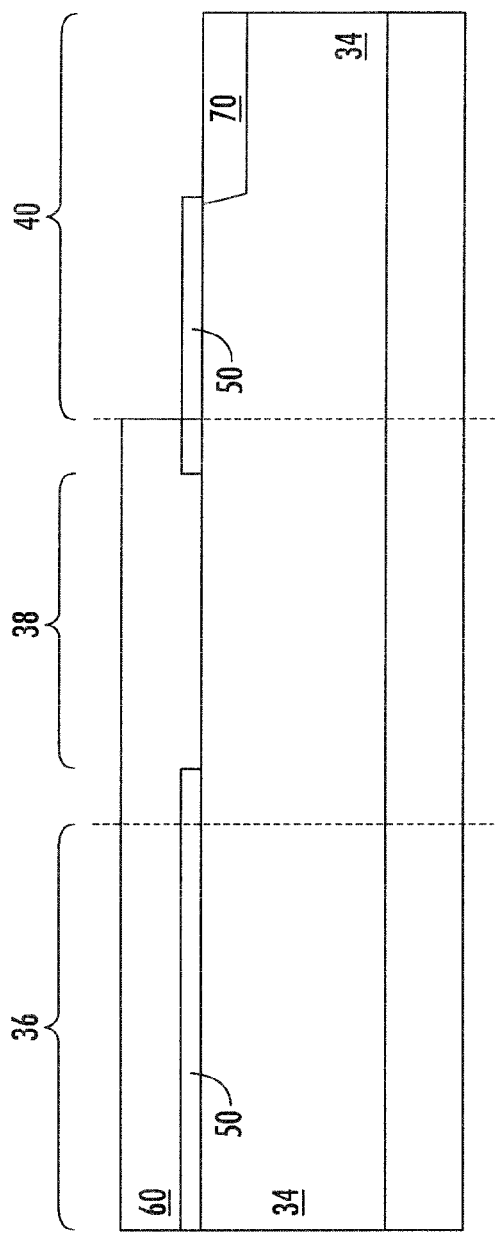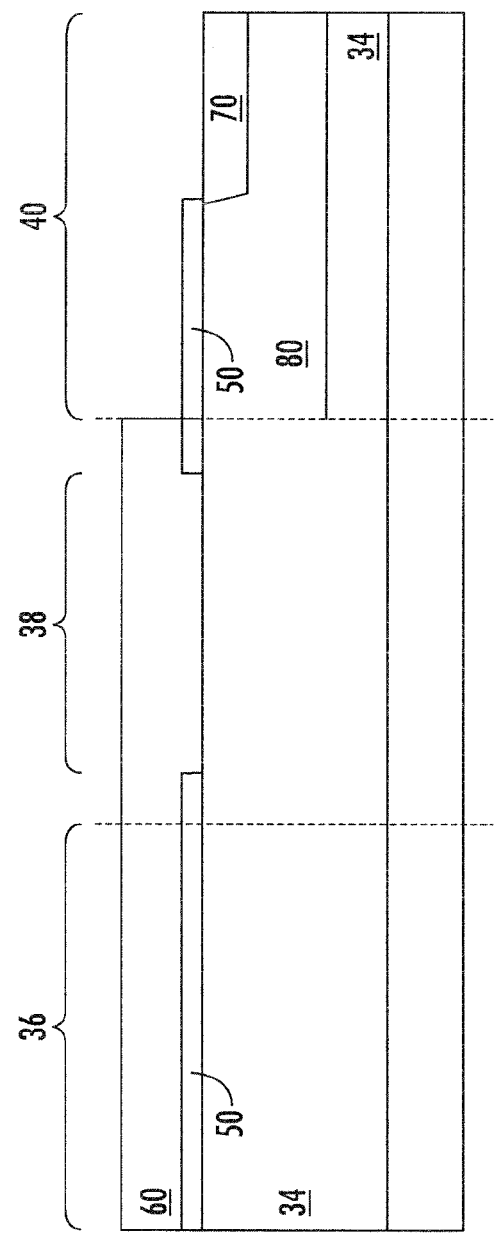

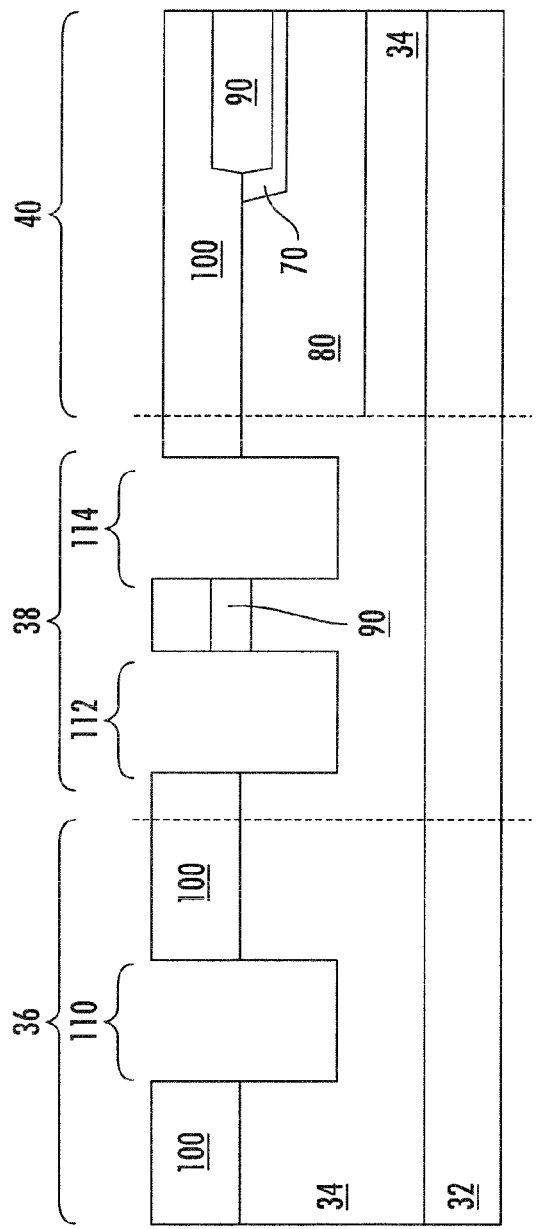
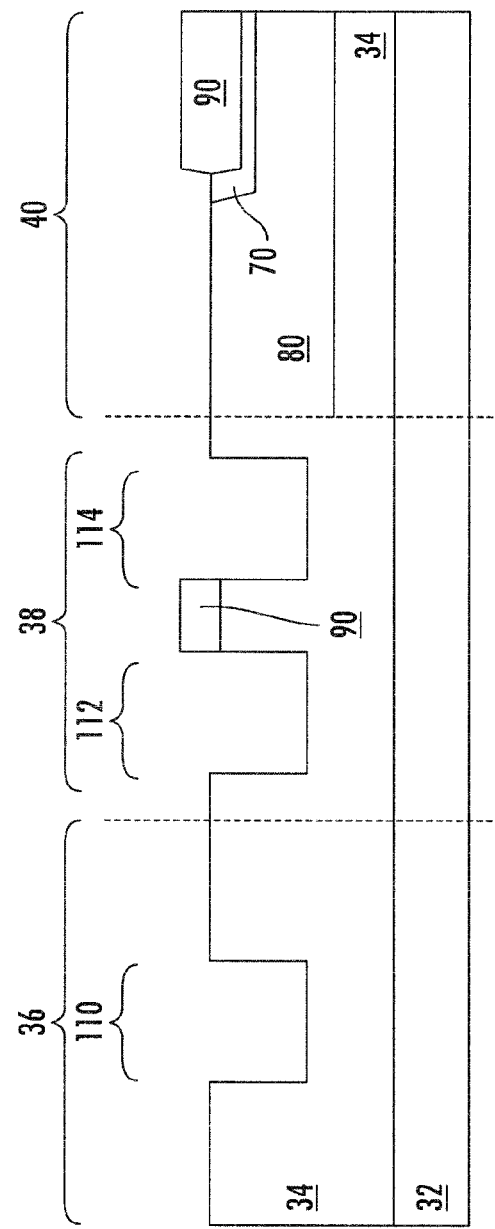
FIG. 11
FIG. 12

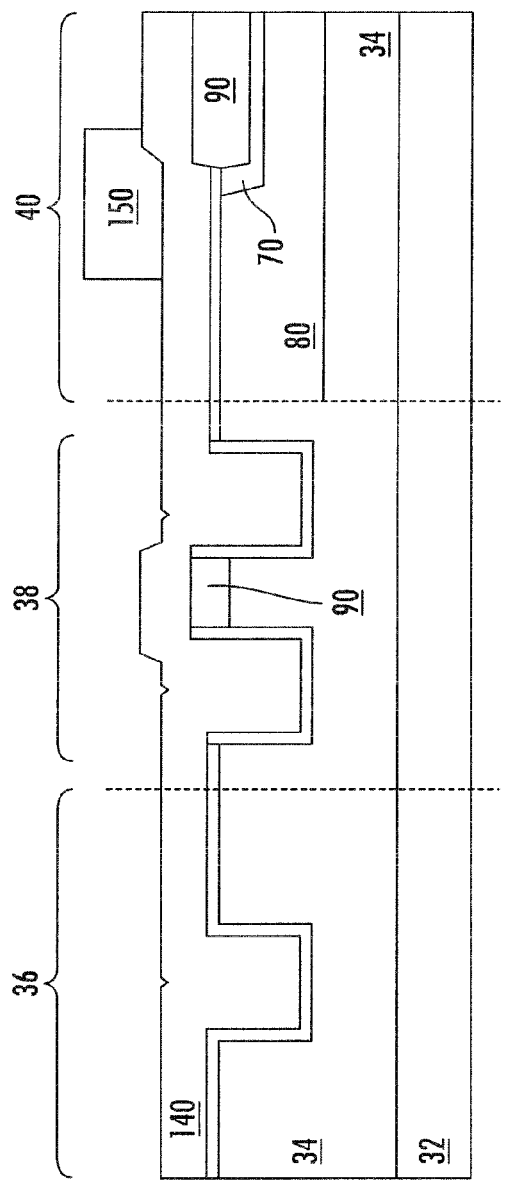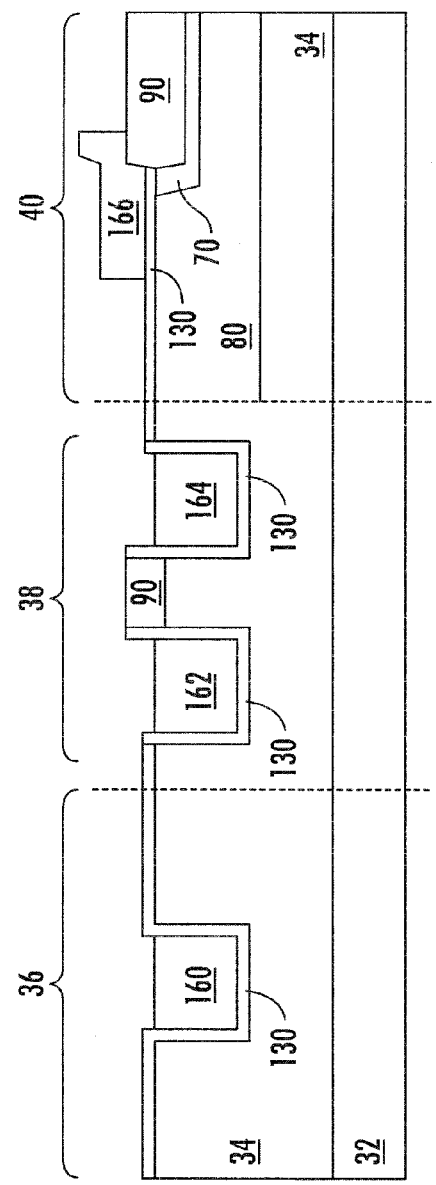

INTEGRATED TRENCH GUARDED SCHOTTKY DIODE COMPATIBLE WITH POWERDIE, STRUCTURE AND METHOD

CROSS-REFERENCE TO RELATED APPLICATION

This application claims the benefit of provisional U.S. Patent Application Ser. No. 61/291,145 filed Dec. 30, 2009, which is incorporated herein by reference in its entirety.

DESCRIPTION OF THE EMBODIMENTS

It should be noted that some details of the FIGS. have been simplified and are drawn to facilitate understanding of the inventive embodiments rather than to maintain strict structural accuracy, detail, and scale. It should also be noted that not all manufacturing steps are illustrated, as the general methods of semiconductor manufacturing are well known.

Reference will now be made in detail to the present embodiments (exemplary embodiments) of the present teachings, examples of which are illustrated in the accompanying drawings. Wherever possible, the same reference numbers will be used throughout the drawings to refer to the same or like parts.

FIGS. 3-33 are cross sections depicting various intermediate structures formed in accordance with embodiments the present teachings;

Embodiments of the present teachings relate generally to voltage converter structures including diffused metal oxide semiconductor (DMOS) field effect transistors (FET). Embodiments can include the combination of, for example, lateral N-channel DMOS (NDMOS) devices, quasi vertical DMOS (QVDMOS) devices, FETs with isolated bodies from the substrate, etc., combined with Schottky diodes on a single semiconductor die. While the present embodiments describe the device with reference to NDMOS devices, it will be understood that the techniques described herein may be modified by one of ordinary skill to result in PDMOS devices.

As used herein, a "P-body region" refers to a "P-type body region" and does not indicate a doping level. Generally, a P-body region will be doped to a P+ doping level as described below. Similarly, a "P-buried layer" refers to a "P-type buried layer", while an "N-epitaxial layer" refers to an "N-type epitaxial layer." Specific doping levels for the P-buried layer and the N-epitaxial layer are discussed below.

It will be understood that the embodiments below describe the formation of N-channel diffusion metal oxide semiconductor (NDMOS) devices at separate locations on the same piece of silicon or other semiconductor substrate, but it will be recognized that the description can be modified to form PDMOS devices. The devices can be formed at locations on the die which are remote from each other as represented below and in the FIGS., or the devices can be adjacent to each other. Further, because a method of the present teachings is described in reference to the formation of NDMOS devices, the body region (for example) is described as a P-body region (i.e. a P-type body region), while this structure will be an N-body region (i.e. an N-type body region) for PDMOS devices, and is referred to generically as a "body region." Additionally, the "P-buried layer" (PBL, a "P-type buried layer") is referred to generically as a "buried layer."

The present teachings can include a process used to form a Schottky diode and a device including one or more Schottky diodes. In an embodiment, the Schottky diode can be formed using a process flow which forms the Schottky diode, a low side power converter device, and a high side power converter device at the same time. The Schottky diode can be formed using a polysilicon layer which is also used as a gate for the high side device and as a gate for the low side device.

Figure 1:
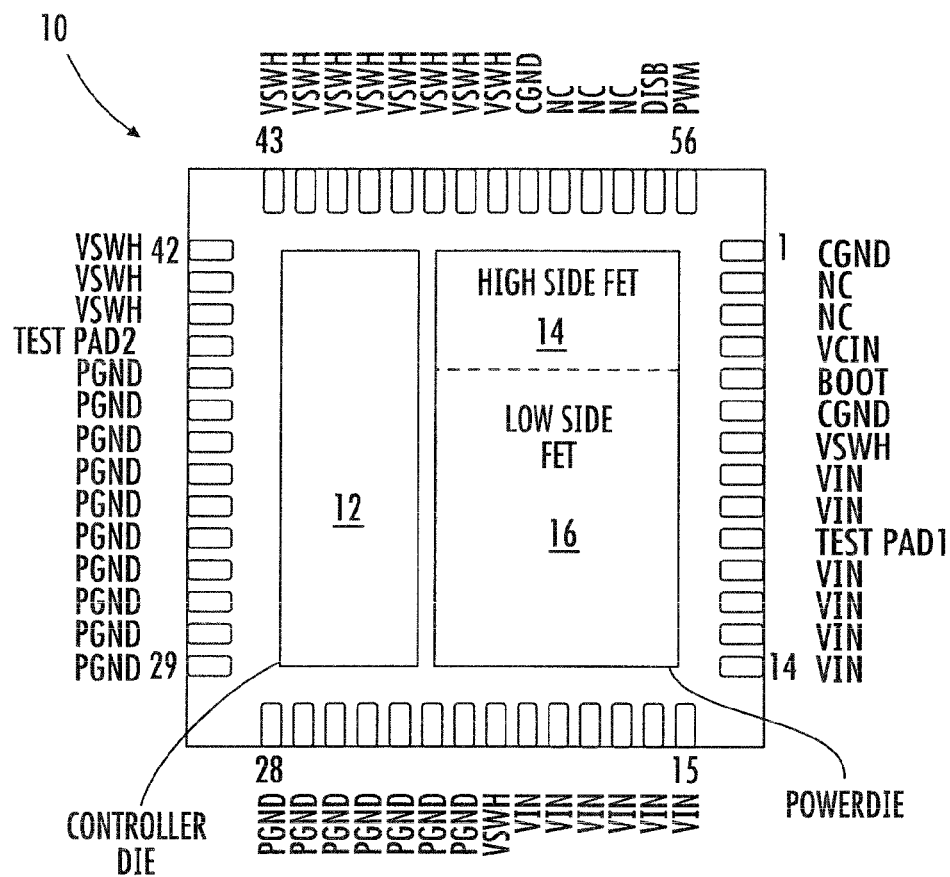
FIG. 1 is a bottom view of a power converter (i.e. voltage converter) device in accordance with an embodiment of the invention.
Figure 2:
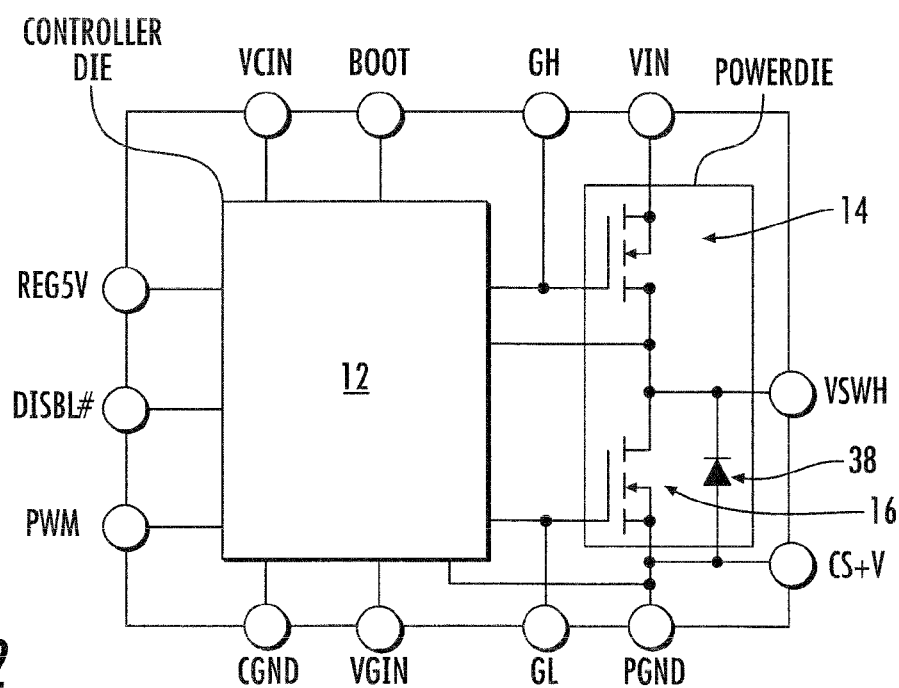
FIG. 2 is a block diagram of an embodiment of a voltage converter device including low side and high side output stage power devices on a single die.

For example, FIG. 1 depicts a semiconductor device 10 in accordance with an embodiment of the present teachings, and includes a trench guarded Schottky diode which can be part of a low side FET circuitry 16 as described in detail below. FIG. 1 depicts at least a portion of a direct current (DC) to DC converter with co-packaged semiconductor dies. The co-packaged dies can include a first integrated circuit (IC) die with control circuitry 12 (i.e. a controller). The control circuitry can include one or more metal oxide semiconductor field effect transistors (MOSFETs). FIG. 1 further depicts a second MOSFET die including one or more high side FET 14 (i.e. high side circuitry) and one or more low side circuit FET 16 (i.e. low side circuitry) on a single semiconductor die, such as a single piece of silicon, gallium arsenide, or other semiconductor material. A block diagram of a DC to DC converter device is depicted in FIG. 2, which also depicts controller circuitry 12, high side FET 14 connected to a $V_{IN}$ pinout and adapted to be electrically coupled with $V_{IN}$ during device operation, and low side circuitry 16 connected to a power ground ($P_{GND}$) pinout and adapted to be electrically coupled with $P_{GND}$ during device operation. The interconnection between the high side FET 14 and the low side FET 16 between $V_{IN}$ and $P_{GND}$ is referred to as a "half bridge." A semiconductor device voltage converter in accordance with an embodiment of the invention can include the package pinouts and pin assignments such as those depicted in FIGS. 1 and 2.

Examples of devices which can be formed in accordance with the present teachings include, but are not limited to, a non-synchronous buck DC to DC converter (i.e. "non-synch buck" converter) with co-packaged high side MOSFET and external Schottky diode, a non-synch buck DC to DC converter with co-packaged high side and low side MOSFETs, a synchronous buck DC to DC converter with co-packaged high side and low side MOSFETs, a boost DC to DC converter with co-packaged MOSFETs (synchronous boost), and a boost DC to DC converter with co-packaged MOSFET and Schottky diodes, among others.

A device design incorporating a single die including both a low side FET and high side FET on a single die is referred to herein as a "PowerDie." A PowerDie can include both a high side power transistor and a low side power transistor on a single piece of silicon or other semiconductor substrate. One type of PowerDie is disclosed in co-pending U.S. patent application Ser. No. 12/470,229, filed May 21, 2009 and titled "Co-Packaging Approach for Power Converters Based on Planar Devices, Structure and Method." This application, commonly assigned with the present application and incorporated herein by reference, describes the use of a PowerDie along with a controller IC having controller circuitry on a separate die which can be packaged separately and placed on a supporting substrate such as a printed circuit board (PCB), or which can be co-packaged as two separate dies into a single semiconductor device, such as an encapsulated semiconductor device. The platform of the PowerDie referenced in the incorporated application can integrate a trench FET as a low side FET and a lateral FET with a deep trench side acting as a high side FET.

Low side power MOSFETs with an integrated Schottky diode can be used in power management applications such as high frequency circuits and high efficiency circuits, and can provide reduced ringing and electromagnetic interference (EMI). An embodiment of the present teachings can provide a Schottky diode integrated in parallel with a low side FET without introducing high leakage.

An exemplary process is depicted in FIGS. 3-30. FIG. 3 depicts three areas of a semiconductor assembly 30 which can include a semiconductor substrate 32 and an overlying epitaxial layer 34. In an embodiment, during dicing of the wafer, the three areas will remain on the same die. The three areas can include a location where a trench FET 36 will be formed, where a Schottky diode 38 will be formed, and where a lateral FET 40 will be formed. In this process and resulting structure, the trench FET 36 formed during the process can be used as a low side FET for a voltage converter device, the lateral FET 40 can be used as a high side FET, and the Schottky diode 38 can be electrically coupled with the trench FET 36 to provide a guarded Schottky diode integrated with the trench FET 36.

For purposes of this application, a "guarded" Schottky diode refers to a Schottky diode which, in cross section, has a trench on either side which provides a reduced electric field at a surface of the Schottky diode junction. Further, a Schottky diode "integrated" with the trench FET refers to a Schottky diode which is formed on, and resides over and within, the same substrate which includes the trench FET, and is formed simultaneously during the formation of the trench FET. Additionally, the Schottky diode anode can be provided by a trench FET source metal, and the Schottky diode cathode can be provided by a trench FET drain metal.

The epitaxial layer 34 can include silicon, and can be between about 0.5 micrometers (μm) and about 10 μm thick, and can overlie the semiconductor substrate 32 which can be between about 50 μm and about 800 μm thick. In an embodiment, the epitaxial layer 34 can be doped with an N-type dopant as depicted in FIG. 4 to a dose of between about 1E15 atoms/cm$^2$ and about 5E17 atoms/cm$^2$ during or after formation.

After forming the FIG. 4 device, a blanket oxidation-resistant layer 50 of a material such as silicon nitride ($Si_2N_3$) is formed over the surface of the epitaxial layer 34, then an oxidation mask 52 is formed to result in a structure similar to that of FIG. 5. The oxidation-resistant layer 50 can be formed to a thickness of between about 100 angstroms (Å) and about 5,000 Å (5 kiloangstroms KÅ). The oxidation mask 52 includes an opening over the Schottky diode 38 and the lateral FET 40, and covers the trench FET 36 as depicted.

Subsequently, the oxidation-resistant layer 50 is patterned using the oxidation mask 52 as a pattern, then the oxidation mask 52 is removed. A patterned P-buried layer (PBL) mask 60 is formed over the surface of the epitaxial layer 34 and over the patterned oxidation-resistant layer 50 as depicted in FIG. 6. The PBL mask 60 covers the trench FET 36 and the Schottky diode 38, and exposes the lateral FET 40. As depicted, the pattern of the PBL mask 60 is different than the pattern of the oxidation-resistant layer 50.

An N-drift implant is performed to result in an N-drift region 70 within the lateral FET as depicted in FIG. 7, which will provide a drain region of the completed lateral FET 40. The N-drift implant can include an implant of an N-type dopant such as arsenic or phosphorus to a dose of between about 1E11 atoms/cm$^2$ and about 5E13 atoms/cm$^2$. The N-drift implant is blocked by both the PBL mask 60 and the patterned oxidation-resistant layer 50.

Next, a PBL implant is performed to result in the PBL 80 as depicted in FIG. 8. The PBL implant can include an implant of a P-type dopant such as boron to a dose of between about 1E12 atoms/cm$^2$ and about 1E14 atoms/cm$^2$ to a depth of between about 0.5 micrometers (μm) and about 3 μm within epitaxial layer 34 using an implant energy of between about 300 keV to about 2000 keV. The PBL implant is blocked by the PBL mask 60, but passes through the patterned oxidation-resistant layer 50 to result in the PBL 80 within the lateral FET as depicted. In an alternate embodiment, the PBL implant is performed before the N-drift implant.

Subsequently, the PBL mask 60 is removed and a thermal oxidation process is performed, for example in accordance with known field oxide processes, to result in the FIG. 9 structure including field oxide 90. In an exemplary field oxidation process, silicon from the epitaxial layer 34 combines with supplied oxygen to form a silicon dioxide layer 90. Field oxide 90 can be between about 500 Å and about 10 KÅ thick, and can extend between about 250 Å and about 5 KÅ into the epitaxial layer 34.

Figure 9:
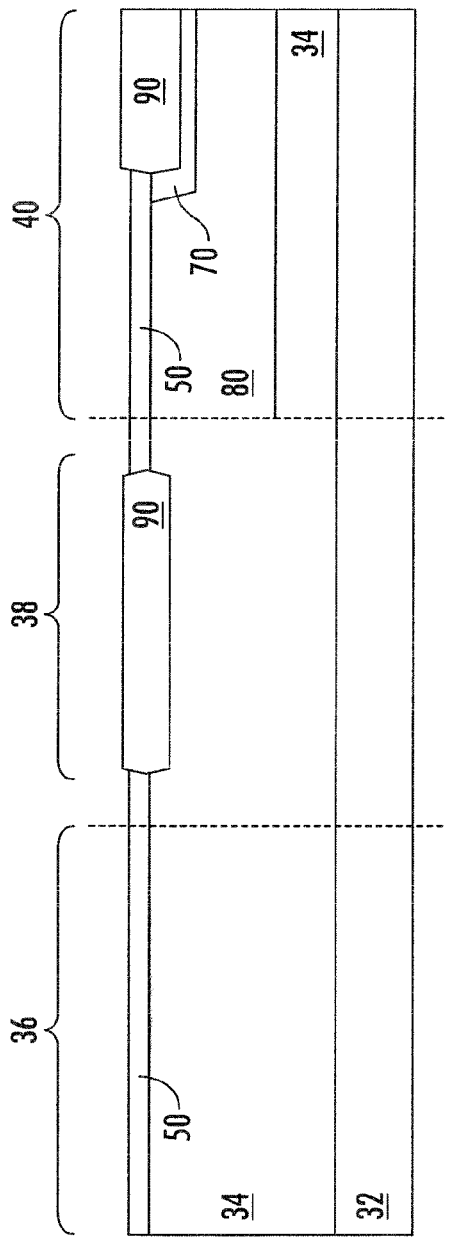
Figure 10:
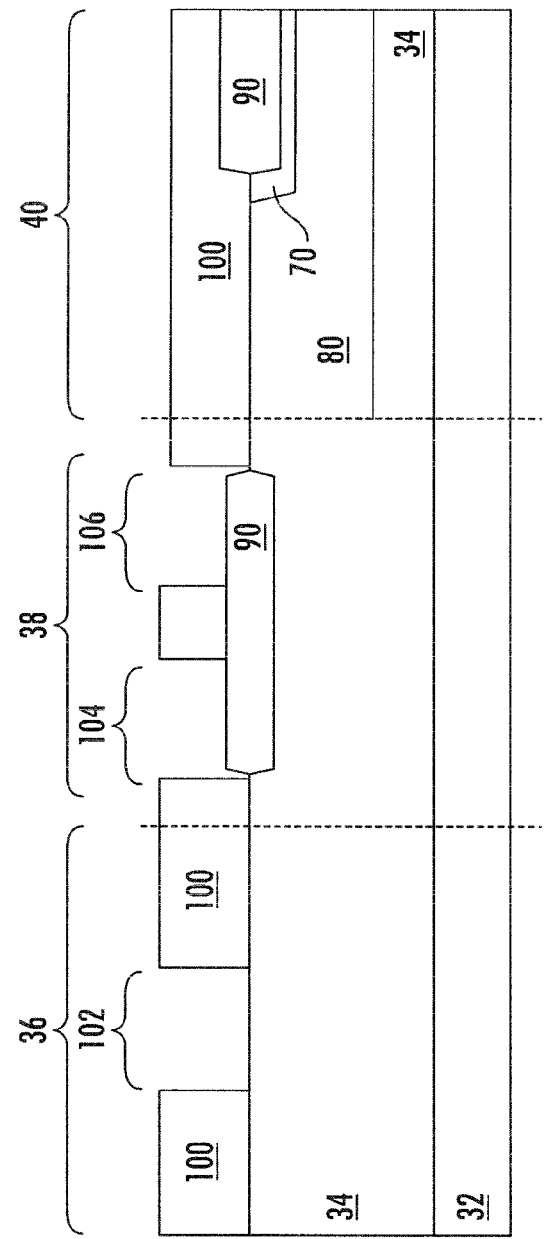

After completing a structure similar to that of FIG. 9, the oxidation-resistant layer 50 is removed and a patterned trench mask 100 as depicted in FIG. 10 is formed. The trench mask 100 exposes portions of the trench FET 36 and the Schottky diode 38, and covers the lateral FET 40. In an embodiment, a single opening 102 is formed over the depicted trench FET 36, and a pair of openings 104, 106 are formed over the depicted Schottky diode 38.

After forming trench mask 100, the exposed field oxide 90 and epitaxial layer 34 are etched to form a trench 110 within the trench FET and a pair of trenches 112, 114 in the Schottky diode as depicted in FIG. 11. The mask 100 is removed to result in the FIG. 12 structure. The width and depth of the trenches 110, 112, 114 within the epitaxial layer 34 will vary depending on the device being formed, but can be between about 2 KÅ and about 10 KÅ wide, and between about 3 KÅ and about 20 KÅ deep.

Subsequently, exposed silicon is oxidized to form gate oxide 130 between about 50 Å and about 1 KÅ, for example using known gate oxide formation techniques to result in the FIG. 13 structure.

Figure 13:
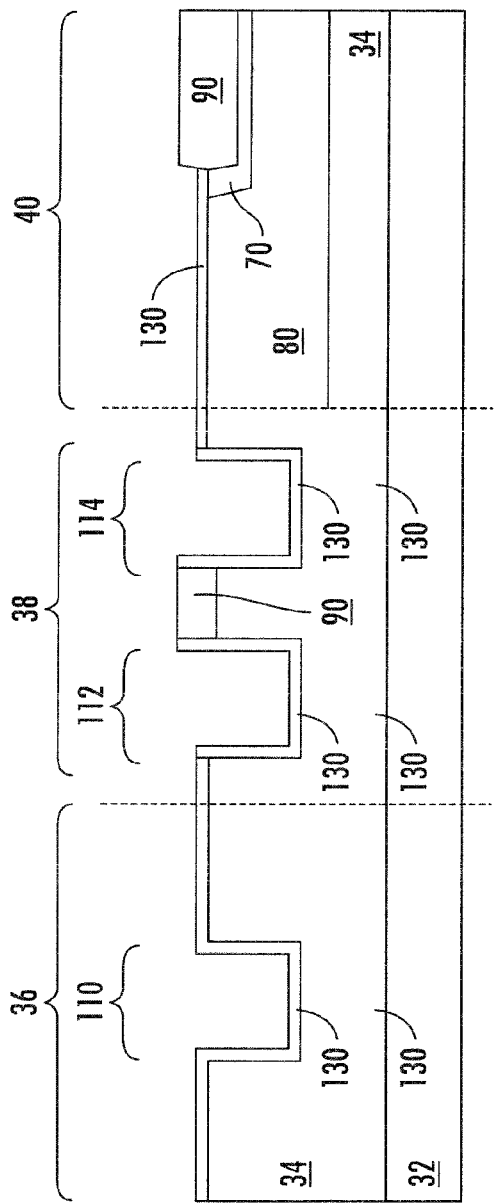
Figure 14:
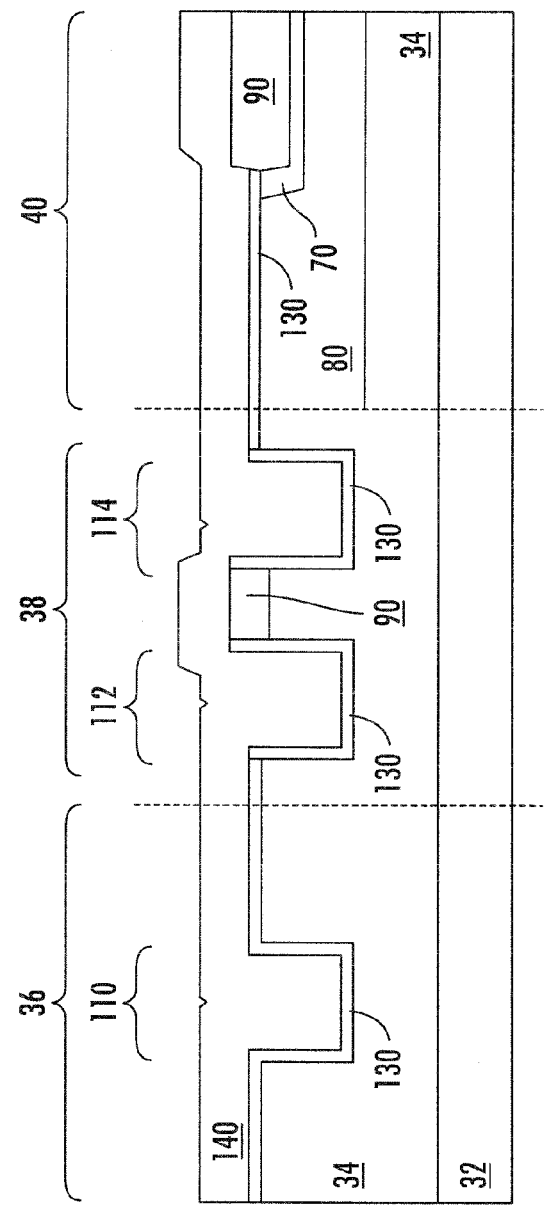
Figure 17:
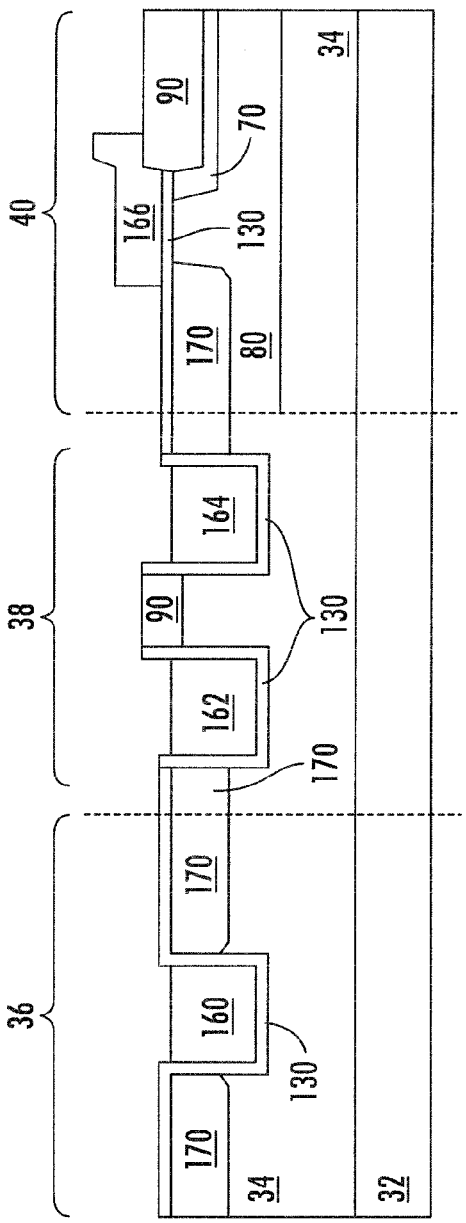

After completing a structure similar to FIG. 13, a blanket gate conductor 140 is formed as depicted in FIG. 14 to fill the trenches 110-114. The gate conductor can be polysilicon, metal, metal silicide, or a combination. A thickness of the blanket gate conductor will generally be at least twice the thickness of the widest trench 110-114, for example between about 4 KÅ to about 20 KÅ thick. Next, a patterned gate mask 150 is formed, which will define a gate of the lateral FET 40.

An anisotropic etch is performed on the FIG. 15 structure to remove the exposed gate conductor 140 over the surface of the gate oxide 130, and to leave the gate conductor within the trenches 110-114 and under mask 150. This forms a gate 160 for the trench FET 36, a gate 162, 164 for the Schottky diode 38, and a gate 166 for the lateral FET 40 as depicted in FIG. 16. It will be understood that the two structures 162, 164 of the Schottky diode gate can be two separate portions a single structure which is rectangular in shape when viewed from above, and thus appear in cross section to be two separate structures. Thus the two cross sectional structures 162, 164 are referred to herein as a trench gate for the Schottky diode.

The gate 162, 164 surrounds a central epitaxial layer portion to provide a portion of a trench guarded Schottky diode as described herein.

Subsequently, an implant of P-type dopants is performed into the epitaxial layer 34 on the FIG. 16 structure to form P-body regions 170 within the trench FET 36 and the lateral FET 40. This implant is blocked from the Schottky diode 38 by the field oxide 90 and from a portion of the lateral FET 40 by the gate 166 and the field oxide 90. A P-type implant to a net dose of between about 1E12 atoms/cm$^2$ and about 1E15 atoms/cm$^2$ within the trench FET 36 would be sufficient. Because the PBL region 80 within the lateral FET 40 includes a net P-type conductivity prior to the P-body implant, the P-body region 170 within the lateral FET 40 can have a net P-type conductivity dose of between about 1E12 atoms/cm$^2$ and about 2E15 atoms/cm$^2$. The P-body implant can be targeted for a depth of between about 2 KÅ and about 10 KÅ. This P-body implant is self-aligned, as it is blocked from the epitaxial layer by various structures without using a mask. For example, the gate 160 blocks the P-body implant from a portion of the trench FET 36. The gate 162, 164 and the field oxide 90 block the P-body implant from the Schottky diode 38. Further, the gate 166 and field oxide 90 block the P-body implant from a portion of the lateral FET 40.

Figure 18:
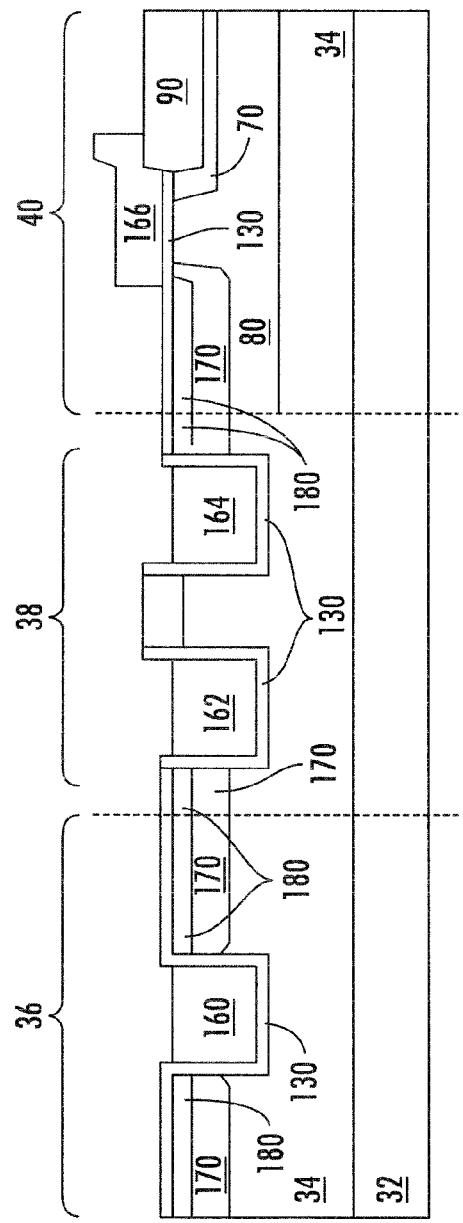

Subsequently, an N-type implant is performed to an N+ doping level to form N-type regions 180 as depicted in FIG. 18. A net N-type dopant dose for the trench FET 36 and the Schottky diode 38 within N-type regions 180 can be between about 5E14 atoms/cm$^2$ and about 1E16 atoms/cm$^2$. The N-type regions can be targeted for a depth of between about 500 Å and about 3 KÅ, and can provide source and drain regions for the trench FET 36 and lateral FET 40.

Figure 19:
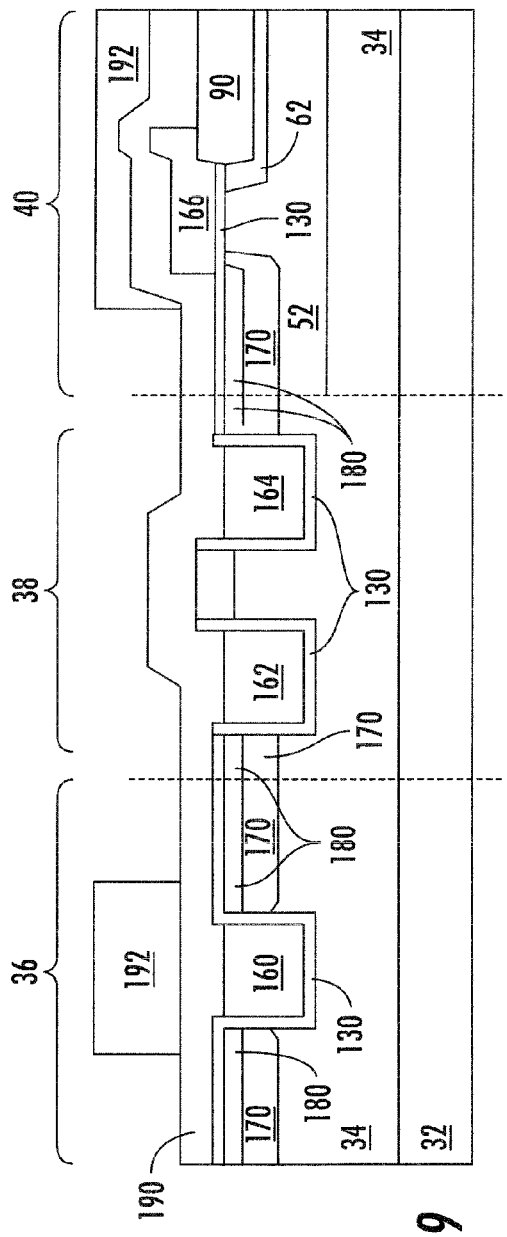

Next, a deposited conformal dielectric 190 such as a layer of tetraethyl orthosilicate is deposited, for example to a thickness of between about 500 Å and about 6,000 Å, as depicted in FIG. 19. A patterned P-body contact mask 192 is formed as depicted over the gate 160 of the trench FET 36 and the gate 166 and N-drift region 70 of the lateral FET 40. An anisotropic etch is performed to etch the exposed deposited conformal dielectric layer 190, the gate oxide 130, and the exposed N-type source/drain regions 180, and to stop on the P-body region 170. The P-body contact mask 192 is then removed to result in the structure as depicted in FIG. 20.

Figure 20:
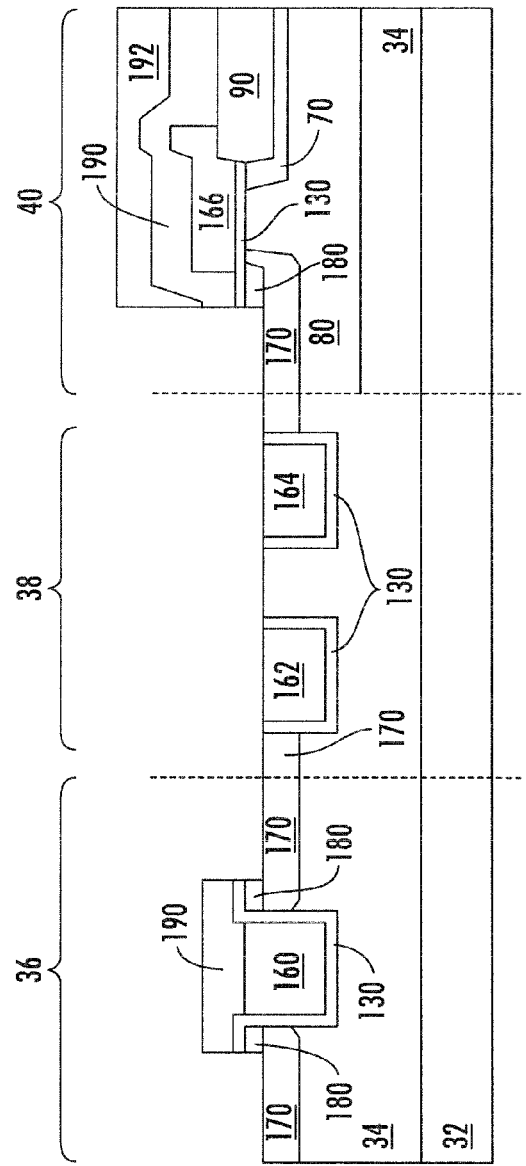
Figure 21:
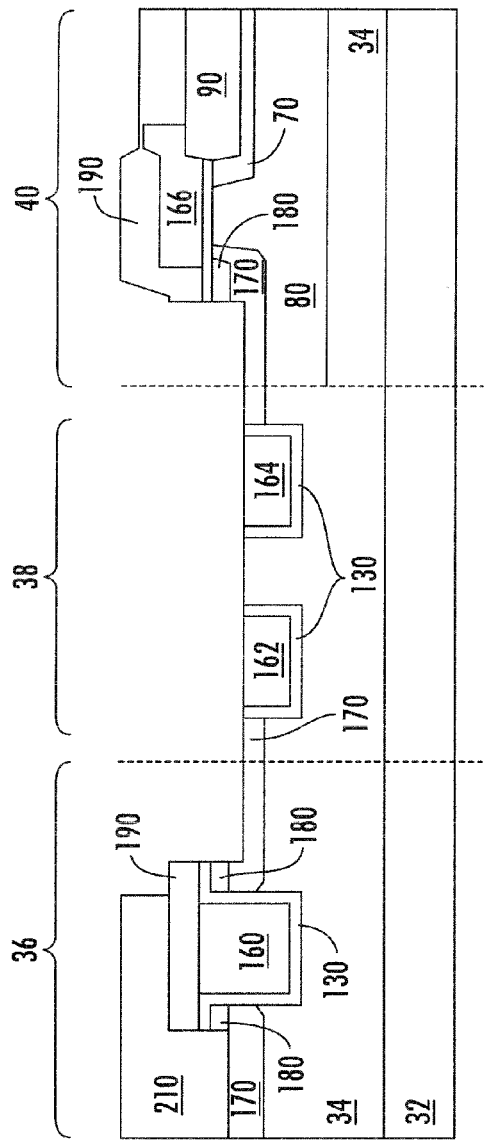
Figure 22:
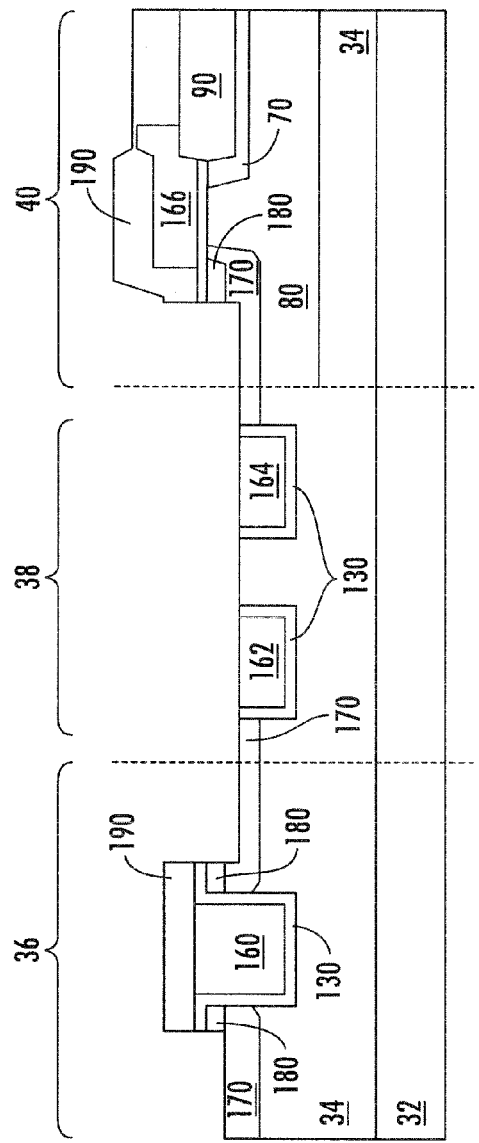

In an alternate embodiment depicted in FIG. 21, a Schottky diode contact etch mask 210 can be formed over the FIG. 20 structure to cover the leftmost P-body region 170 of the trench FET 36, then an etch of the exposed epitaxial layer 34 can be performed to provide a deeper P-body contact region for the Schottky diode. The alignment of mask 210 is noncritical because the etch can use the remaining oxide 190 which overlies the trench FET gate 160 and the lateral FET gate 166 as a mask. This deeper P-body contact region in the Schottky diode 38 can tailor Schottky diode blocking and conduction to improve performance of the Schottky diode. The desired depth of the P-body contact region in the Schottky diode can be obtained from simulation and/or empirically, and will depend on the operating conditions of the Schottky diode for a particular use. After the etch of the epitaxial layer within the Schottky diode 38, the mask 210 is removed to result in the FIG. 22 structure. The process can continue with either of the structures depicted in FIG. 20 or 22, but the process described below will continue with reference to the FIG. 20 structure. In the embodiment of FIGS. 21 and 22, the upper surface of the Schottky diode gate 162, 164 are below at least a portion of the upper surface of P-body region 170, for example the portion within trench FET 36 at the left of FIGS. 21 and 22. This structure includes a deeper P-body contact region in the Schottky diode 38 and tailors the Schottky diode blocking and conduction to improve performance of the Schottky diode 38.

Figure 23:
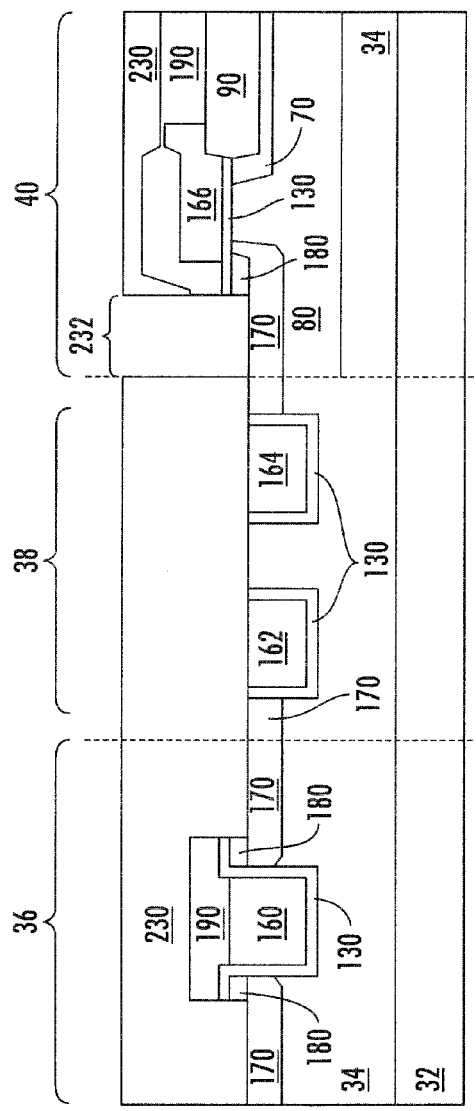
Figure 24:
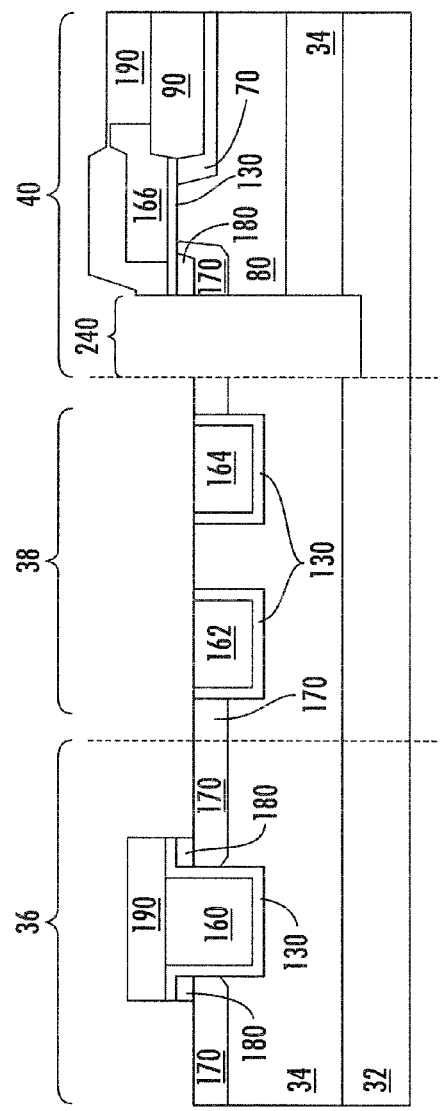

Subsequently, a trench mask 230 having an opening 232 is formed as depicted in FIG. 23. The opening defines a trench into the source 170 of the lateral FET 40. Next, the FIG. 23 structure is etched and the trench mask 230 is removed to result in the FIG. 24 structure including trench 240. The depth of the etch which forms trench 240 is targeted to etch through exposed structures within the epitaxial layer 34 such as P-body region 170 and PBL 80 to expose the N+ semiconductor substrate 32.

Figure 25:
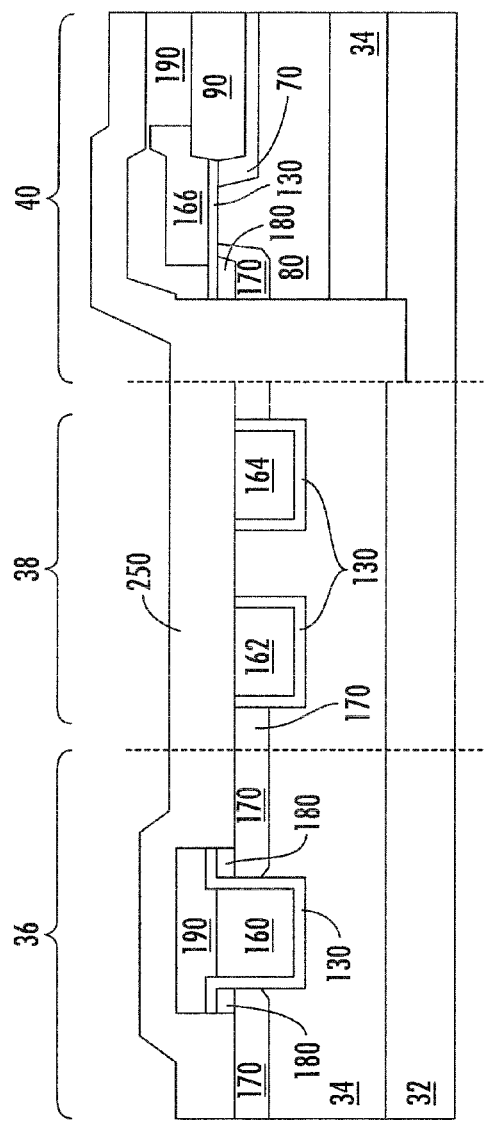
Figure 26:
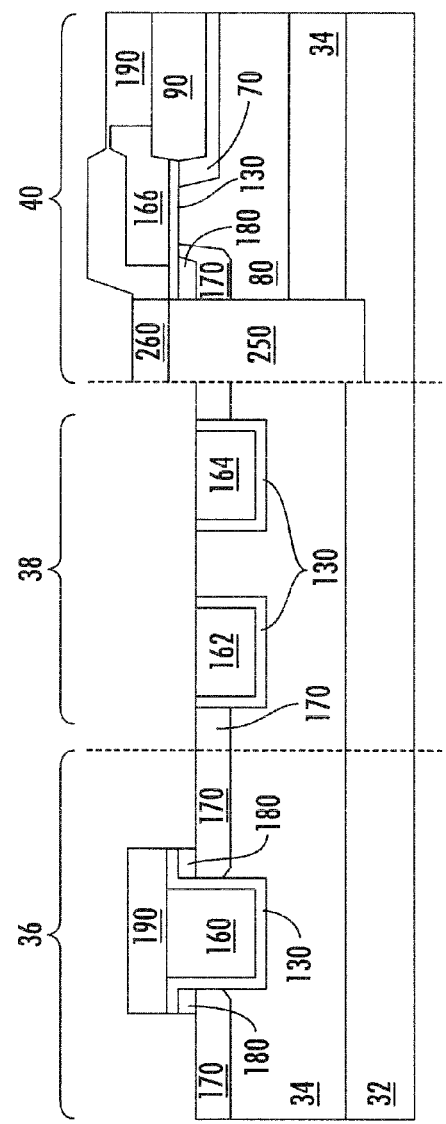

A blanket conductive layer such as polysilicon 250 is formed as depicted in FIG. 25 to a thickness sufficient to fill trench 240, then an anisotropic etch is performed to leave polysilicon 250 contacting the lateral FET source 180 as depicted in FIG. 26. The polysilicon 250 electrically couples the lateral FET source 180 with the substrate 32. A patterned oxide 260 which electrically isolates the trench conductor 250 is formed to complete the FIG. 26 structure.

Figure 27:
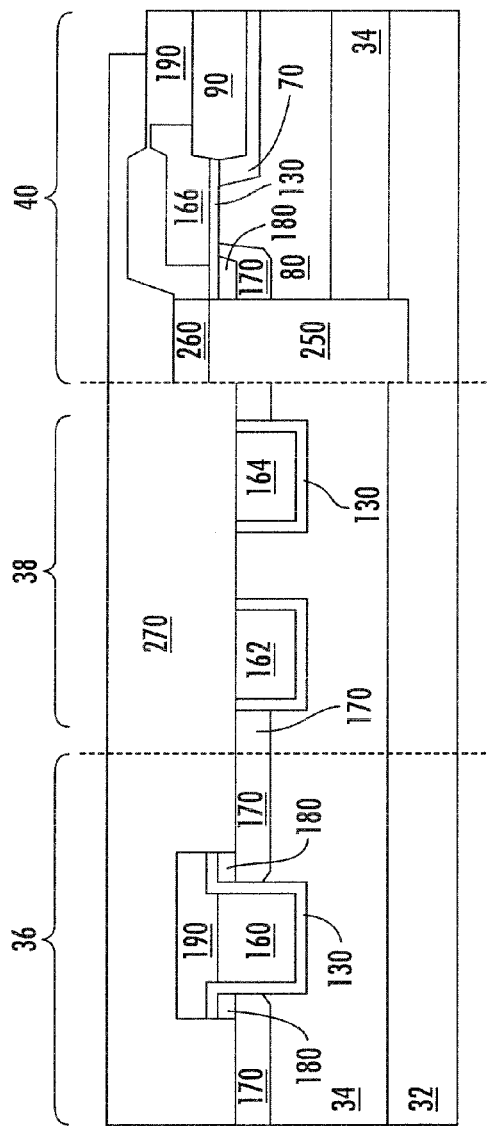
Figure 28:
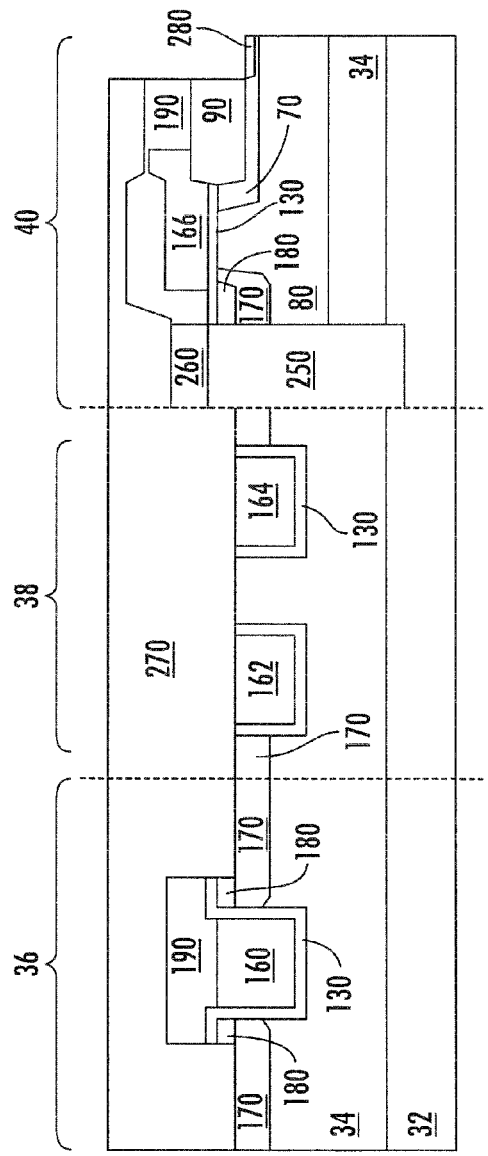

Next, a mask 270 is formed as depicted in FIG. 27 which exposes the drain region 70 of the lateral FET 40, and an oxide etch is performed to remove the oxide 190, 90 from over the drain region 70 as depicted in FIG. 28. An N-type implant is performed to form an N+ lateral FET drain contact region 280. The implant can be targeted to provide an N-type dose of between about 5E14 atoms/cm$^2$ and about 1E16 atoms/cm$^2$ within lateral FET drain contact region 280.

Figure 29:
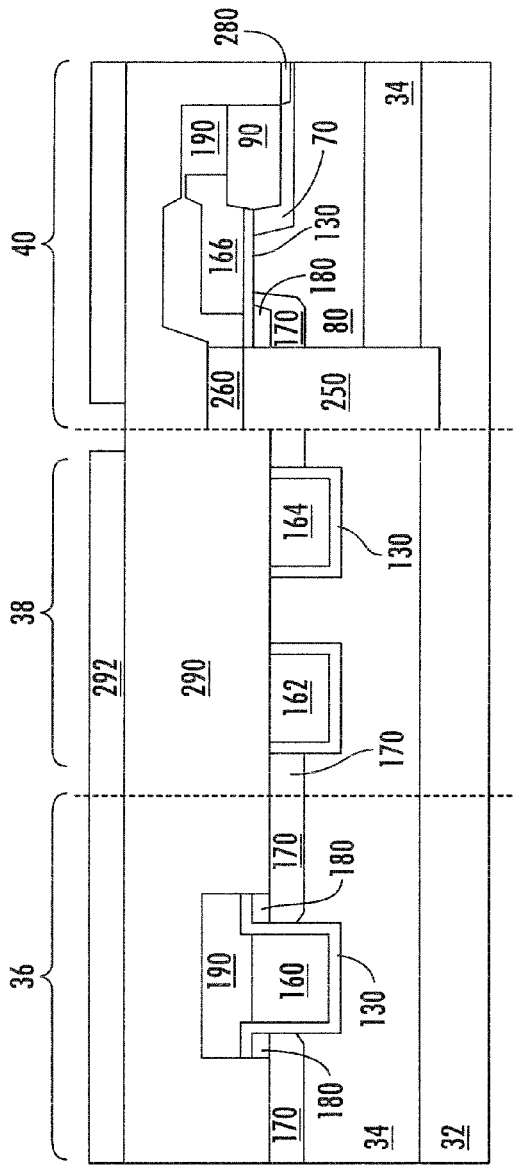

Subsequently, mask 270 is removed and a blanket metal 290 is formed as depicted in FIG. 29. A metal mask 292 is formed and the metal 290 is etched to electrically isolate the metal covering the trench FET 36 and the Schottky diode 38 from the metal covering the lateral FET 40, to result in separate isolated metal portions 290A and 290B depicted in FIG. 30. The metal is separated at a location between the Schottky diode 38 and the lateral FET 40. The separation is depicted at a location overlying the trench conductor 250 for simplicity of explanation, however the separation can be formed at another wafer location between the lateral FET 40 and the location of an adjacent trench FET similar to trench FET 36 and a Schottky diode similar to that of Schottky diode 38, such as those depicted in FIG. 31. After removing the metal mask 292, a metal layer 300 is formed over the bottom surface of the substrate to result in the completed structure of FIG. 30.

Figure 30:
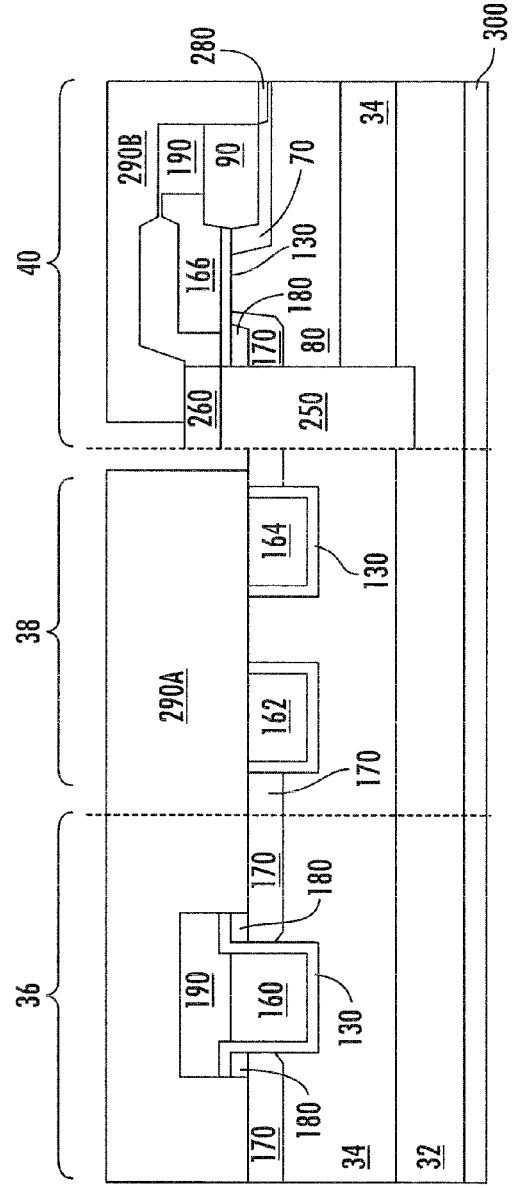

As depicted in FIG. 30, metal 290A electrically contacts the sources 180 of the trench FET devices and can provide a source contact for the trench FETs. Further, the trench gate 162, 164 of the Schottky diode 38 is electrically coupled to the source regions 180 of the trench FET 36 through conductor 290A. If more than one trench FET 36 is formed and electrically coupled to another Schottky diode 38, metal 290 can electrically connect the source regions 180 of all trench FETs 36 and each trench gate 162, 164 of every Schottky diode 38. Metal 290A can also function as the anode of the Schottky diodes. Back side metal 300 can function as the drain of the trench FET devices 36, as the cathode of the Schottky diodes 38, and as the source of the lateral FET 40. Metal 290B electrically contacts the drain of the lateral FET 40 and can provide a drain contact for the trench FET. Trench conductor 250 electrically couples the lateral FET source 180 with the N+ substrate 32, which in turn is electrically coupled to metal 300.

It will be recognized that the trench FET 36 of FIG. 30 is a trench-gate vertical diffusion metal oxide semiconductor (VDMOS) device, and that the lateral FET 40 is a lateral diffusion metal oxide semiconductor (LDMOS) device. The Schottky diode is integrated into a cell of the VDMOS device, for example because the Schottky diode is formed on, and resides over and within, the same substrate which includes the trench FET, and is formed simultaneously during the formation of the trench FET. The gates of the trench FETs and the gates of the Schottky diodes are formed within trenches in the semiconductor substrate, and can therefore be described as "trench gates."

Figure 31:
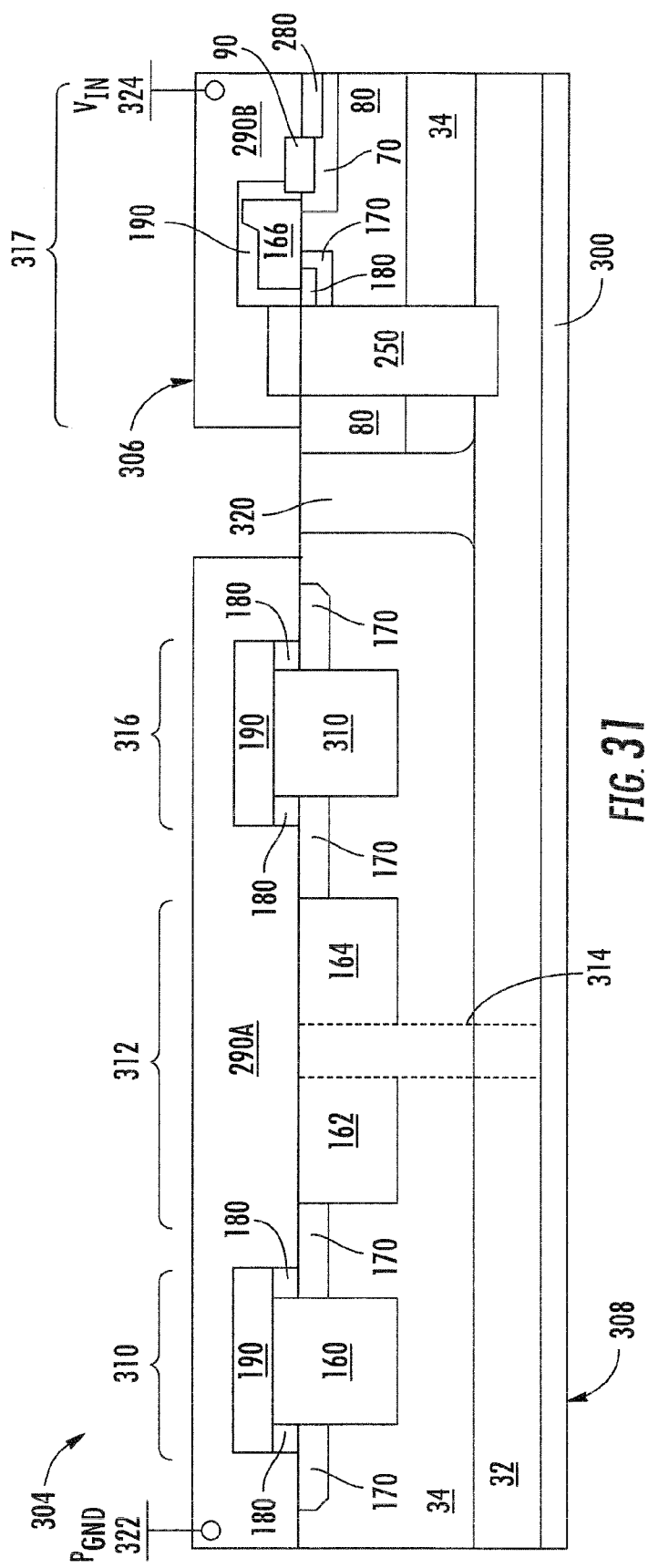

FIG. 31 depicts a simplified cross section of a device which can be formed in accordance with the process discussed above. Various elements such as gate oxide is omitted from the depiction because of scale and ease of explanation. The device can include a first trench FET 310 electrically coupled with a Schottky diode 312. Functionality of the Schottky diode 312 includes region 314 between metal 290A and back side metal 300. The Schottky diode 312 is guarded by gate 162, 164 which is formed within the epitaxial layer 34. The Schottky diode 312 is electrically coupled to the first FET 310 through metal 290A which electrically couples the source 180 of the first trench FET 310 to the trench gate 162, 164 of the Schottky diode 312. The device can further include a second trench FET 316 electrically coupled with the Schottky diode 312. The second trench FET 316 is electrically coupled to the Schottky diode 312 and the first trench FET 310 through metal 290A which electrically couples the source 180 of the second trench FET 316 to the Schottky diode trench gate 162, 164 and to the source region 180 of the first trench FET 310. The die area including the trench FETs 310, 316 and the Schottky diode 312 can be separated from the die area including the lateral FET 317, for example using an isolation region 320 such as a P-doped region or a shallow trench isolation.

In use, metal 290A is adapted to be electrically coupled to device ground ($P_{GND}$) 322. Further, metal 290B is adapted to be electrically coupled to device voltage in ($V_{IN}$) 324. The back side metal 300 provides a switched node of the voltage converter, and thus provides the output of the voltage converter output stage. The Schottky diode 312 can remove or reduce minority carriers (i.e. holes in a PMOS device or electrons in an NMOS device) from the epitaxial layer, thereby decreasing leakage.

It will be understood that additional Schottky diodes can be formed to the left side of the trench FET 316 and/or to the right side of trench FET 316, in which case all Schottky gates can be interconnected and connected to trench FET sources 180 through metal 290A. Additionally, a voltage converter device can include more than one lateral FET 317.

The device of FIG. 31 includes die 304 having a circuit side 306 and a non-circuit side 308 opposite the circuit side 306. The device includes a voltage converter output stage provided by the trench FETs 310, 316, the Schottky diode 312 which is integrated with the trench FETs 310, 316, and the lateral FET 317 which form circuitry on the circuit side 308 of the die. Metal 290A is electrically coupled to the sources 180 of the trench FETs, and to the trench gate 162, 164 of the Schottky diode 312. The semiconductor substrate 32 is the trench FET drain in accordance with DMOS devices, and thus the trench FET drain is passed to the back side metal 300 through contact with the semiconductor substrate 32. Thus the back side metal 300 provides the cathode for the Schottky diode 312. The back side metal 300 is also electrically coupled to the lateral FET source 180 through the trench conductor 250. The drain 70 of the lateral FET 317 is electrically coupled to metal 290B through lateral FET drain contact 280. Device $V_{IN}$ 324 can be tied to metal 290B, while device $P_{GND}$ 322 can be tied to metal 290A. Back side metal 300 on the non-circuit side of the semiconductor substrate 32 of the die 304 thus provides the output of the output stage.

As depicted in FIG. 31, a top surface of the FETs formed on a circuit side of the device (i.e. the side with FET gates, as opposed to the non-circuit side of the device on which back side metal 300 is formed) are above a top of the Schottky diode. That is, the upper surfaces of trench FET gates 160 and 310 are above the upper surface of the Schottky diode gate 162, 164. Further, the top surface of the depicted lateral FET gate 166 is above the upper surfaces of the Schottky diode gate 162, 164. It will be understood that additional trench FETs, additional Schottky diodes, and a plurality of lateral FETs can be formed on and within the semiconductor assembly. Generally, each trench FET used as a low side FET for a power converter (i.e. voltage converter) will have one associated Schottky diode, but can have more than one associated Schottky diode. In an embodiment, a voltage converter can include a plurality of lateral FETs, a plurality of trench FETs, and a plurality of Schottky diodes, wherein one or more of the Schottky diodes is integrated with one of the trench FETs as described above.

Figure 32:
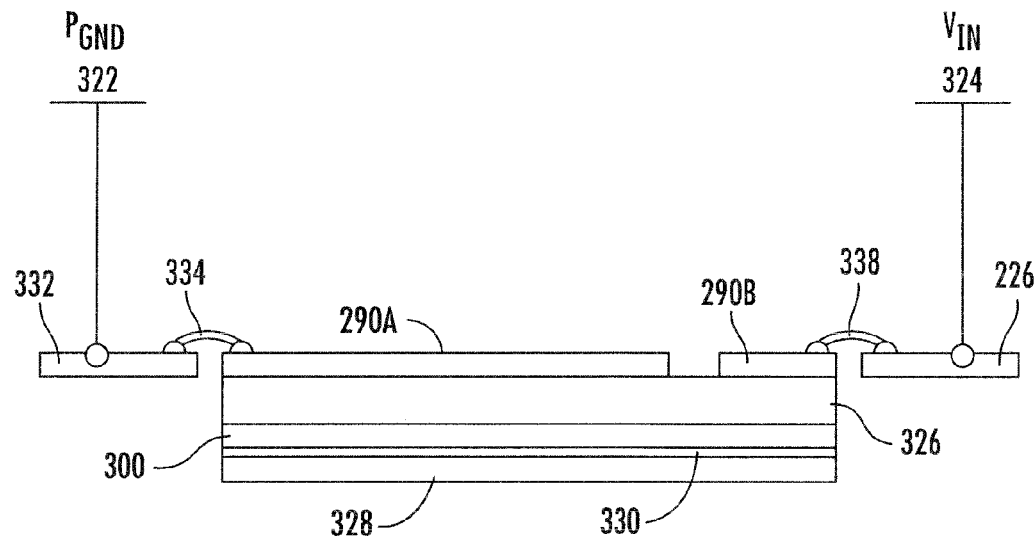

FIG. 32 depicts a structure in accordance with the present teachings including a semiconductor device such as the one depicted and described with reference to FIG. 31 attached to a lead frame. The semiconductor device can include a wafer substrate assembly 326, which can include the semiconductor substrate 32 and the epitaxial layer 34 of FIG. 31, for example. The back side metal 300 is electrically coupled to a lead frame die pad 328 with a conductive die attach material 330. Metal 290A can be electrically coupled to $P_{GND}$ 322 through a first lead frame lead 332 and a first bond wire 334. Metal 290B can be electrically coupled to $V_{IN}$ 324 through a second lead frame lead 336 and a second bond wire 338.

Figure 33:
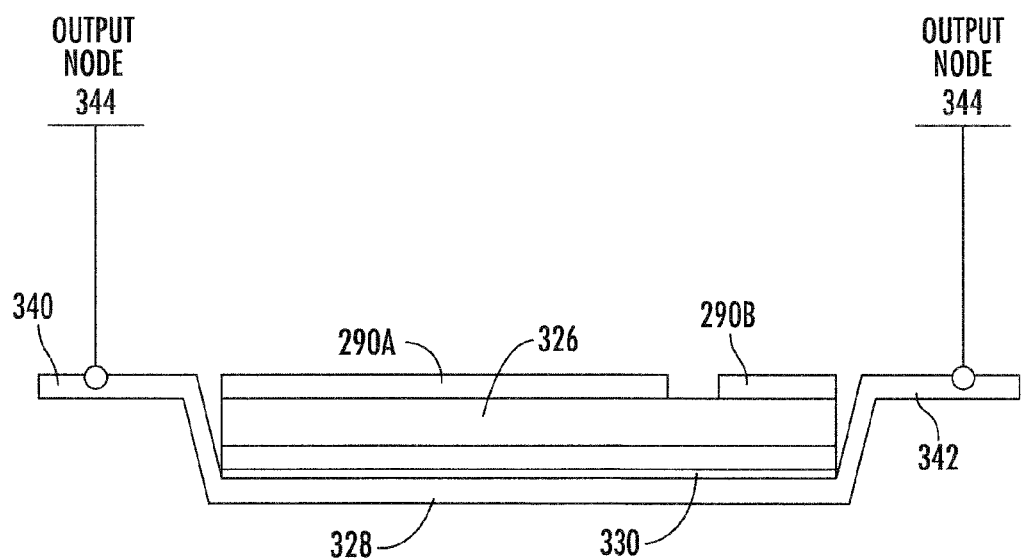

FIG. 33 depicts the FIG. 32 structure at a different cross sectional location. In this depiction, the die pad 328 is electrically coupled to a first lead frame lead 340 and a second lead frame lead 342. Because the back side metal 300 is electrically coupled to the lead frame pad 328 through conductive die attach adhesive 330, and the output node (switched node) is supplied by the device to the back side metal, the output node of the device can be accessed through the lead frame leads 340, 342.

Figure 34:
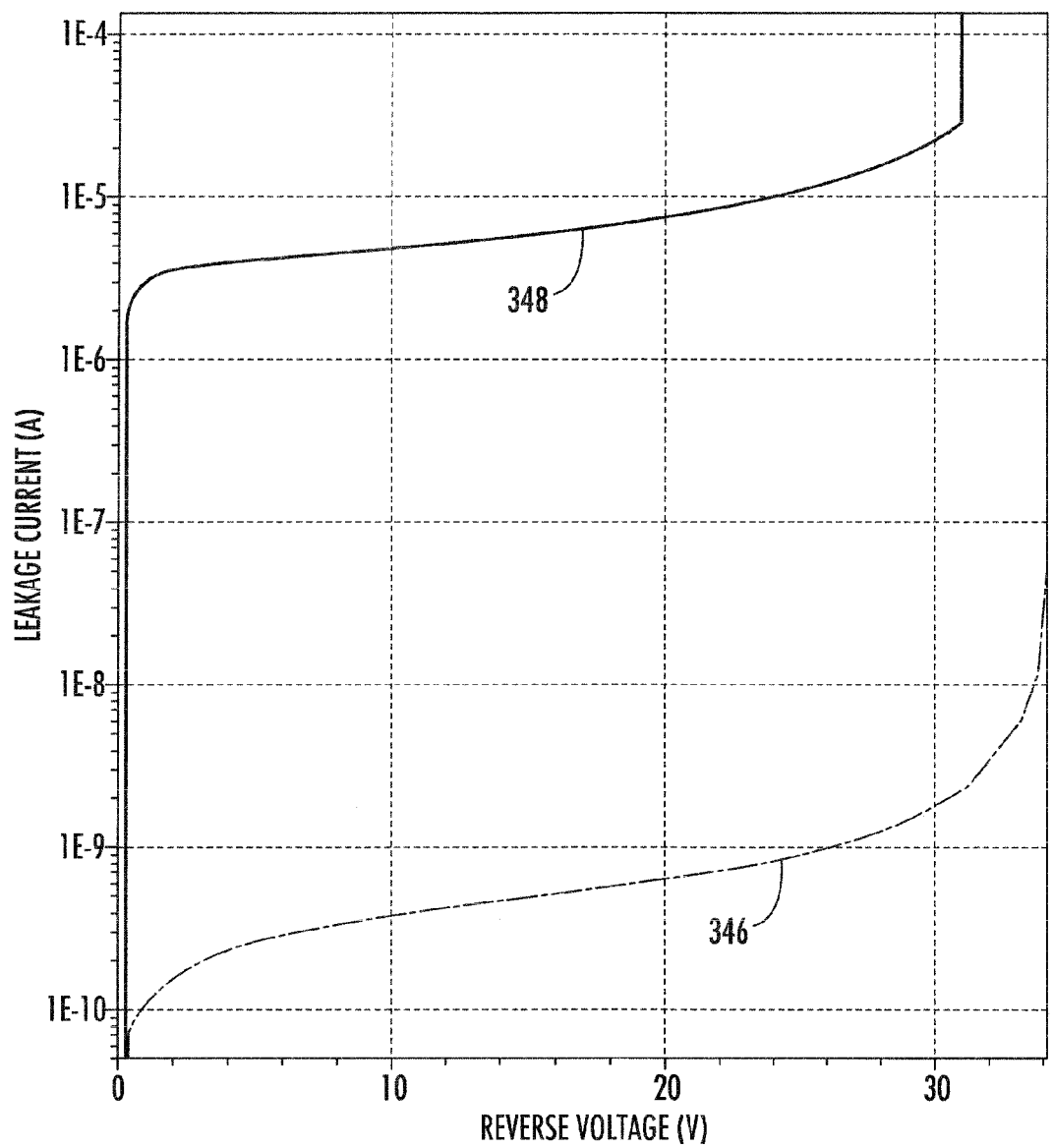
FIGS. 34 and 35 are graphs depicting various characteristics of devices formed in accordance with embodiments of the present teachings.

FIG. 34 is a graph depicting the reverse bias leakage characteristics for a trench FET 346 compared to a trench guarded Schottky diode 348 in accordance with the present teachings. The areas of both devices were simulated as both being the same. The leakage current for the trench guarded Schottky diode is four orders of magnitude higher than the leakage current of the trench. This illustrates that the Schottky diode exhibits high leakage at a given voltage. The area of the trench guarded Schottky diode relative to the area of the trench FET can be designed to be low so that leakage can be reduced. That is, the area of the trench guarded Schottky diode can be sized relative to the area of the trench FET to result in an acceptable leakage for the device being designed while maintaining an acceptable use of die area.

Figure 35:
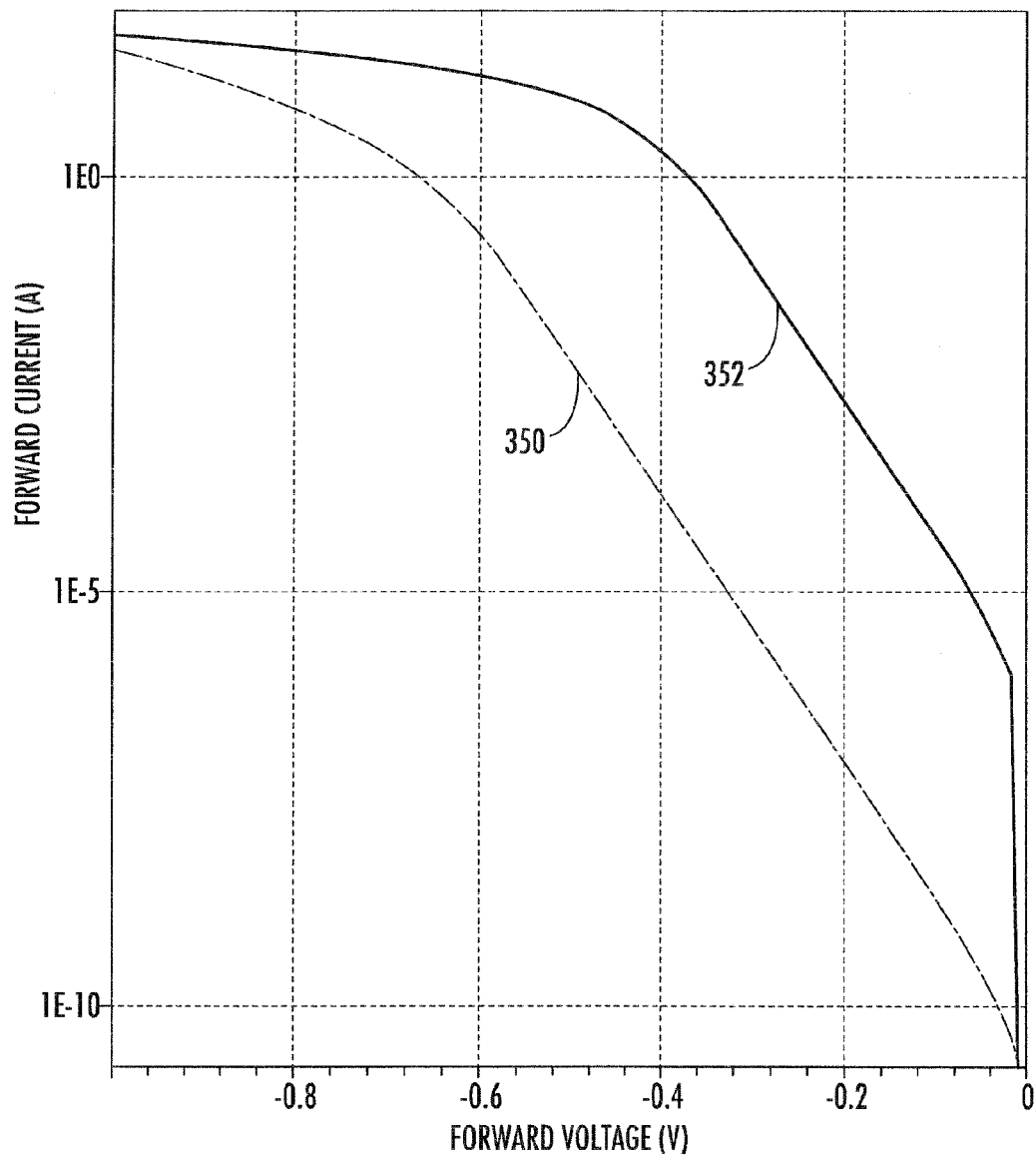

FIG. 35 is a graph depicting the forward bias characteristics for a trench FET 350 and a trench guarded Schottky diode 352 in accordance with the present teachings. The forward conduction density for the Schottky diode is four orders of magnitude higher than that of the forward conduction density for the trench FET at any given forward voltage. Thus a percentage of Schottky diode area is sufficient to carry the full trench FET current. The forward voltage drop of the Schottky diode is about 300 mV lower that of the trench FET at any given current. This will help to ensure that the trench guarded Schottky diode will begin to conduct before the trench FET portion and help ensure low power loss.

Figure 36:
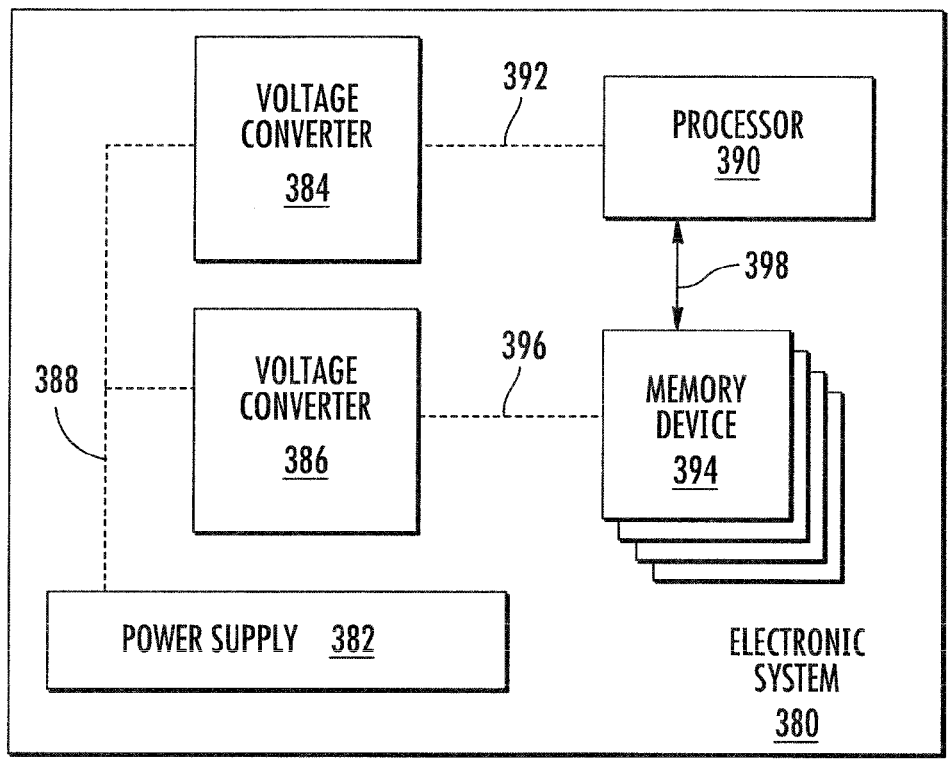
FIG. 36 is a block diagram of an electronic system in accordance with an embodiment of the present teachings.

A semiconductor device including a one or more trench FETs having one or more integrated Schottky diodes and one or more lateral FETs as described above may be attached along with other semiconductor devices such as one or more microprocessors to a printed circuit board, for example to a computer motherboard, for use as part of an electronic system such as a personal computer, a minicomputer, a mainframe, or another electronic system. A particular embodiment of an electronic system 380 according to the present teachings is depicted in the block diagram of FIG. 36. The electronic system 380 can include a power supply 382 such as a converted AC power source or a DC power source such as DC power supply or battery. The power supply 382 can power one or more voltage converters such as DC to DC voltage converters. The embodiment of FIG. 36 depicts a first voltage converter 384 and a second voltage converter 386, each of which receives power from the power supply 382 from a first power bus 388. The electronic system 380 can further include a digital circuit die such as a processor 390 which may be one or more of a microprocessor, microcontroller, embedded processor, digital signal processor, or a combination of two or more of the foregoing. The processor 390 can receive power converted by the voltage converter 384 along a second power bus 392. Electronic system 380 can further include one or more memory devices 394 such as static random access memory, dynamic random access memory, read only memory, flash memory, or a combination of two or more of the foregoing. The memory 394 can receive power converted by the second voltage converter 386 along a third power bus 396. Data can be passed between the processor 390 and the memory device 394 along a data bus 398. Thus electronic system 380 may be a device related to telecommunications, the automobile industry, semiconductor test and manufacturing equipment, consumer electronics, or virtually any piece of consumer or industrial electronic equipment.

Figure 37:
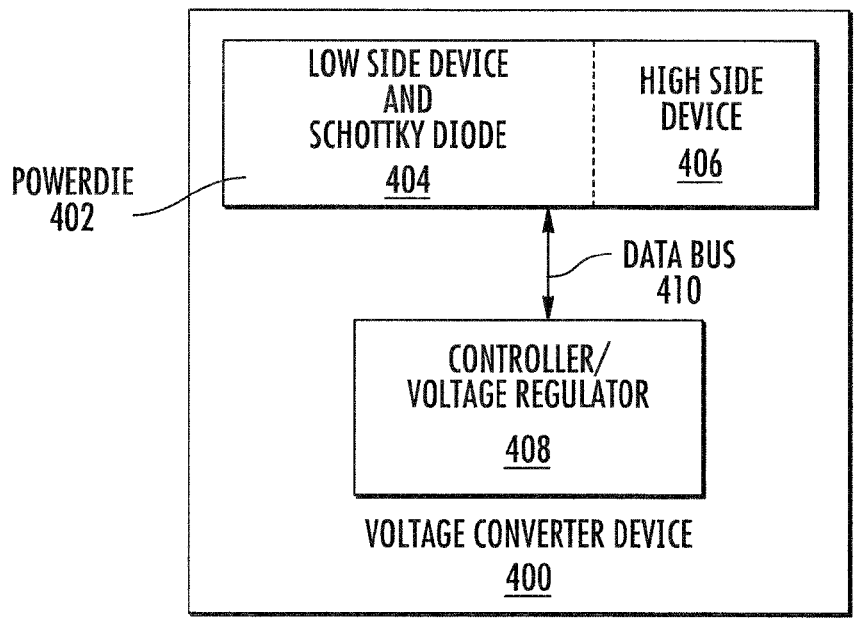
FIG. 37 is a block diagram of a voltage converter in accordance with an embodiment of the present teachings.

FIG. 37 is a block diagram of a voltage converter in accordance with an embodiment of the present teachings. Each of the voltage converters 384, 386 depicted in FIG. 36 can include the structures depicted in the FIG. 37 voltage converter. The voltage converter 400 can include a first die (e.g. a PowerDie) 402 having a low side device and Schottky diode 404 which can include at least one trench FET and at least one integrated Schottky diode as described above. The PowerDie can further include a high side device 406 which can include at least one lateral FET as described above. The PowerDie includes the low side FET and Schottky diode 404 and the high side FET 406 on the same semiconductor substrate (i.e. the same piece of semiconductor material, such as a single silicon die, gallium die, etc.). The voltage converter device 400 can further include and a second die (e.g. a controller die) 408 which can include a controller/voltage regulator adapted to control the PowerDie 402, and a data bus 410 adapted to pass data between the PowerDie 402 and the controller die 408.

The present teachings have been described with reference to an output stage for a DC to DC voltage converter. It will be realized that the present teachings are also applicable to other semiconductor device circuit stages in addition to a voltage converter output stage, for example various semiconductor device driver stages such analog driver stages.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. In addition, while a particular feature of the disclosure may have been described with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

The invention claimed is:

1. A method of integrating a Schottky diode and a trench field effect transistor (FET), comprising:
   etching at least one opening through a field oxidation layer and into a semiconductor substrate to form at least one Schottky diode trench gate opening;
   etching at least one opening into the semiconductor substrate to form at least one trench FET gate opening;

growing a gate oxide layer in the at least one Schottky diode trench gate opening and the at least one trench FET gate opening;

depositing polysilicon within the at least one Schottky diode trench gate opening and the at least one trench FET gate opening to fill at least a portion of the at least one Schottky diode trench gate opening and at least a portion of the at least one trench FET gate opening;

etching the field oxide layer and at least a portion of the polysilicon within the Schottky diode trench gate opening;

forming at least one Schottky diode trench gate having, in cross section, a first portion and a second portion, wherein the field oxide layer is interposed between the first portion and the second portion of the Schottky diode trench gate; and implanting a dopant into the semiconductor substrate, wherein the field oxide layer masks dopant implantation into the semiconductor substrate between the first portion and the second portion of the at least one Schottky diode trench gate.

2. A method of integrating a Schottky diode and a trench field effect transistor (FET), comprising:

etching at least one opening through a field oxidation layer and into a semiconductor substrate to form at least one Schottky diode trench gate opening;

etching at least one opening into the semiconductor substrate to form at least one trench FET gate opening;

growing a gate oxide layer in the at least one Schottky diode trench gate opening and the at least one trench FET gate opening;

depositing polysilicon within the at least one Schottky diode trench gate opening and the at least one trench FET gate opening to fill at least a portion of the at least one Schottky diode trench gate opening and at least a portion of the at least one trench FET gate opening;

etching the field oxide layer and at least a portion of the polysilicon within the Schottky diode trench gate opening; and further comprising:

depositing the polysilicon comprises depositing a blanket polysilicon layer;

forming a patterned gate mask over the blanket polysilicon layer, and etching the blanket polysilicon layer to form the at least one trench FET trench gate, the at least one Schottky diode trench gate, and at least one lateral FET gate.

3. The method of claim 2, further comprising:

etching the blanket polysilicon layer forms an upper surface of the at least one lateral FET gate, an upper surface of the at least one trench FET gate, and an upper surface of the at least one Schottky diode trench gate, wherein the upper surface of the at least one lateral FET gate is above the upper surface of the at least one trench FET gate and is above the upper surface of the at least one Schottky diode trench gate.

4. The method of claim 3, further comprising:

subsequent to etching the blanket polysilicon layer, etching the at least one Schottky diode trench gate such that an upper surface of the at least one trench FET gate is above an upper surface of the at least one Schottky diode trench gate.

5. A method used during the formation of a semiconductor device, comprising:

forming an epitaxial layer over a semiconductor substrate;

forming a patterned oxidation-resistant layer over the epitaxial layer;

forming a patterned buried layer mask over the patterned oxidation-resistant layer;

with the patterned buried layer mask and the patterned oxidation-resistant layer in place, performing a first dopant implant to implant a first dopant having a first conductivity type into the epitaxial layer, wherein the first dopant implant is blocked by both the patterned buried layer mask and the patterned oxidation-resistant layer;

with the patterned buried layer mask and the patterned oxidation-resistant layer in place, performing a second dopant implant to implant a second dopant having a second conductivity type different from the first conductive type into the epitaxial layer, wherein the second dopant implant is blocked by the patterned buried layer mask and passes through the patterned oxidation-resistant layer;

removing the patterned buried layer mask;

with the oxidation-resistant layer in place, oxidizing the epitaxial layer to form a field oxide layer; and subsequent to oxidizing the epitaxial layer, removing the oxidation-resistant layer.

6. The method of claim 5, further comprising:

forming a trench mask over the field oxide layer;

etching the field oxide and the epitaxial layer using the trench mask as a pattern; and performing a third dopant implant to implant a dopant into the epitaxial layer using the etched field oxide to block the third dopant implant.

7. The method of claim 6, further comprising:

forming at least a first opening and a second opening in the epitaxial layer during the etching of the epitaxial layer;

forming a conductive gate layer over the epitaxial layer and within the first opening and within the second opening in the epitaxial layer; and etching the conductive gate layer to form a Schottky diode gate within the first opening and a trench field effect transistor (FET) gate within the second opening.

8. The method of claim 7, further comprising:

the etching of the conductive gate layer further forms a lateral FET gate over the epitaxial layer.

* * * * *